United States Patent
Choi et al.

(10) Patent No.: US 10,177,334 B2
(45) Date of Patent: Jan. 8, 2019

(54) ORGANIC LIGHT EMITTING DEVICE AND DISPLAY DEVICE HAVING THE SAME

(71) Applicant: SAMSUNG DISPLAY CO., LTD., Yongin-si, Gyeonggi-do (KR)

(72) Inventors: Eunji Choi, Bucheon-si (KR); Jungmin Moon, Busan (KR); Jahyun Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 14/861,775

(22) Filed: Sep. 22, 2015

(65) Prior Publication Data
US 2016/0276601 A1    Sep. 22, 2016

(30) Foreign Application Priority Data

Mar. 16, 2015 (KR) ......................... 10-2015-0036209

(51) Int. Cl.
*H01L 51/00* (2006.01)
*H01L 27/32* (2006.01)
*H01L 51/50* (2006.01)

(52) U.S. Cl.
CPC ........ *H01L 51/508* (2013.01); *H01L 51/5008* (2013.01); *H01L 51/006* (2013.01); *H01L 51/0054* (2013.01); *H01L 51/0067* (2013.01)

(58) Field of Classification Search
CPC ............... H01L 51/0054; H01L 51/006; H01L 51/0067; H01L 51/5008; H01L 51/508
See application file for complete search history.

(56) References Cited

U.S. PATENT DOCUMENTS 6,566,807 B1 * 5/2003 Fujita .................. H01L 51/5012
                                                                   313/504
7,126,271 B2 * 10/2006 Lee ..................... H01L 51/5048
                                                                   313/504
(Continued)

FOREIGN PATENT DOCUMENTS

CN        101159319 A       4/2008
CN        101163663 A       4/2008
(Continued)

*Primary Examiner* — Dawn L Garrett
(74) *Attorney, Agent, or Firm* — Lewis Roca Rothgerber Christie LLP

(57) ABSTRACT

An organic light emitting device includes a first electrode, a hole transport region provided on the first electrode, an emission layer provided on the hole transport region, an electron transport region provided on the emission layer, and a second electrode provided on the electron transport region. The electron transport region includes an electron transport layer provided on the emission layer, a first mixed electron transport layer provided on the electron transport layer, and a second mixed electron transport layer provided on the first mixed electron transport layer. The first mixed electron transport layer includes a first electron transport compound and a second electron transport compound different from the first electron transport compound mixed at a first ratio. The second mixed electron transport layer includes the first electron transport compound and the second electron transport compound mixed at a second ratio different from the first ratio.

19 Claims, 7 Drawing Sheets

(56) References Cited

U.S. PATENT DOCUMENTS

| | | | |
|---|---|---|---|
| 7,981,523 B2* | 7/2011 | Hosokawa | C07C 211/54 313/504 |
| 2002/0055015 A1* | 5/2002 | Sato | H01L 51/5052 428/690 |
| 2004/0124766 A1* | 7/2004 | Nakagawa | H01L 51/0064 313/504 |
| 2005/0084713 A1* | 4/2005 | Kido | H01L 51/5048 313/504 |
| 2006/0261732 A1* | 11/2006 | Miller | H01L 27/3213 313/504 |
| 2009/0167159 A1* | 7/2009 | Song | H01L 51/5048 313/504 |
| 2009/0315024 A1* | 12/2009 | Song | H01L 51/0077 257/40 |
| 2011/0127513 A1* | 6/2011 | Lee | C07D 401/04 257/40 |
| 2012/0214993 A1* | 8/2012 | Aihara | C07D 239/26 544/180 |
| 2014/0014927 A1* | 1/2014 | Kim | H01L 51/0067 257/40 |
| 2014/0353596 A1* | 12/2014 | Kim | H01L 51/5064 257/40 |
| 2016/0164018 A1* | 6/2016 | Lee | H01L 51/508 257/40 |

FOREIGN PATENT DOCUMENTS

| | | |
|---|---|---|
| CN | 102119158 A | 7/2011 |
| CN | 102574813 A | 7/2012 |
| KR | 10-2011-0056715 A | 5/2011 |
| KR | 10-2012-0010438 A | 2/2012 |
| KR | 10-2013-0050713 A | 5/2013 |
| KR | 10-2013-0115171 | 10/2013 |
| KR | 10-2014-0001581 A | 1/2014 |
| KR | 10-2014-0008126 A | 1/2014 |

* cited by examiner

ORGANIC LIGHT EMITTING DEVICE AND DISPLAY DEVICE HAVING THE SAME

CROSS-REFERENCE TO RELATED APPLICATION

This patent application claims priority to and the benefit of Korean Patent Application No. 10-2015-0036209, filed on Mar. 16, 2015, the entire content of which is incorporated herein by reference.

BACKGROUND

The present disclosure herein relates to an organic light emitting device and a display device having the same.

Flat display devices may be mainly classified into light emitting devices and light receiving devices. The light emitting devices include flat cathode ray tubes, plasma display panels, organic light emitting displays (OLEDs), etc. The OLED is a self-luminescent display and has desired features of wide viewing angles, good contrast and rapid response time.

Thus, the OLED is applicable in displays for mobile devices (such as digital cameras, video cameras, camcorders, personal digital assistants, smart phones, ultra-thin laptops, tablet personal computers, flexible displays, etc.), or large-sized electronic products (such as ultra-thin televisions or large-sized electric products), and has received much attention.

The OLED realizes light (e.g., color light) based on the principle that holes and electrons injected from a first electrode and a second electrode are recombined in an emission layer, and excitons obtained by the combination of the injected holes and electrons emit light during the transition thereof from an excited state to a ground state.

SUMMARY

An aspect according to one or more embodiments of the present disclosure is directed toward an organic light emitting device having high efficiency, long life time (lifespan), and small efficiency changes with respect to the temperature (e.g., when the temperature changes).

An aspect according to one or more embodiments of the present disclosure is directed toward a display device including an organic light emitting device having high efficiency, long life time, and small efficiency changes with respect to the temperature.

According to one or more embodiments of the inventive concept, an organic light emitting device includes a first electrode, a hole transport region on the first electrode, an emission layer on the hole transport region, an electron transport region on the emission layer, and a second electrode on the electron transport region. The electron transport region includes an electron transport layer on the emission layer, a first mixed electron transport layer on the electron transport layer, and a second mixed electron transport layer on the first mixed electron transport layer. The first mixed electron transport layer includes a first electron transport compound and a second electron transport compound different from the first electron transport compound mixed at a first ratio, and the second mixed electron transport layer includes the first electron transport compound and the second electron transport compound mixed at a second ratio different from the first ratio.

In some embodiments, the first electron transport compound may be selected from compounds represented by the following Formula Group 1.

Formula Group 1

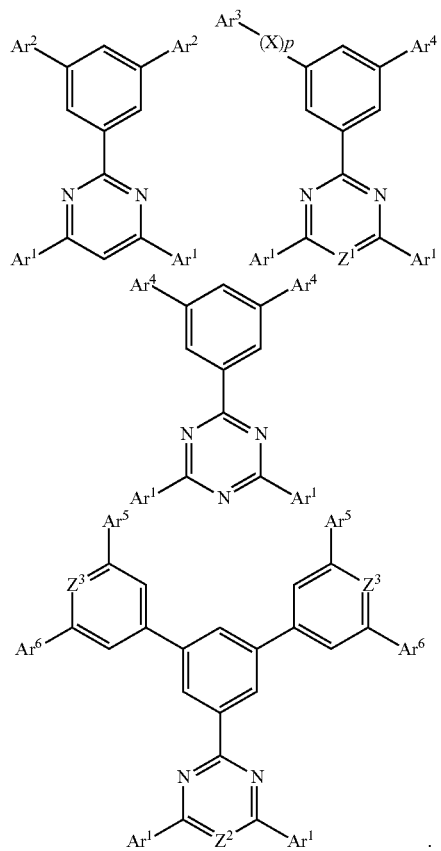

In the above Formula Group 1, $Ar^1$ to $Ar^6$ are each independently selected from the group consisting of hydrogen, deuterium, a substituted or unsubstituted aromatic group, a substituted or unsubstituted condensed aromatic group, a substituted or unsubstituted heteroaromatic group and a substituted or unsubstituted condensed heteroaromatic group, excluding a compound where $Ar^2$ is 1,3,5-trimethylphenyl group. X is a phenylene group or a pyridylene group. P is an integer from 0 to 2, where when P is 2, the two Xs may be same or different. $Z^1$ to $Z^3$ are each independently C or N, excluding a compound where $Z^3$ is C and each of $Ar^5$ and $Ar^6$ is independently a phenyl group.

In other embodiments, $Ar^1$ may be selected from the group consisting of an aromatic group substituted with an alkyl group, a phenyl group or a pyridyl group; a condensed aromatic group substituted with an alkyl group, a phenyl group or a pyridyl group; a heteroaromatic group substituted with an alkyl group, a phenyl group or a pyridyl group; and a condensed heteroaromatic group substituted with an alkyl group, a phenyl group or a pyridyl group. $Ar^2$ may be a condensed phenyl group excluding a substituted or unsubstituted phenyl group or an element in group 16. $Ar^3$ may be a phenyl group, a pyridyl group or a pyrimidyl group. $Ar^4$ may be a substituted or unsubstituted aromatic group having two to four rings or a substituted or unsubstituted heteroaromatic group having two to four rings. $Ar^5$ and $Ar^6$ may be each independently a phenyl group or a pyridyl group.

In still other embodiments, the first electron transport compound may be represented by the following Formula 1.

Formula 1

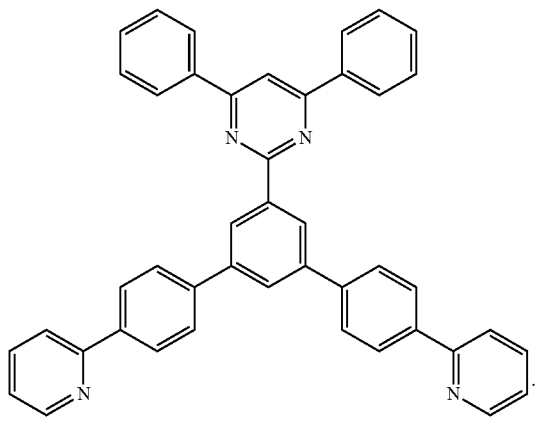

In even other embodiments, the electron transport layer may include the first electron transport compound.

In yet other embodiments, the second electron transport compound may be at least one of LiF, Lithium quinolate (LiQ), $Li_2O$, BaO, NaCl, CsF, Yb, RbCl and RbI.

In further embodiments, the first ratio may be from about 3:7 to about 7:3, and the second ratio is from about 4:6 to about 6:4.

In still further embodiments, the emission layer may include a dopant represented by the following Formula 2.

Formula 2

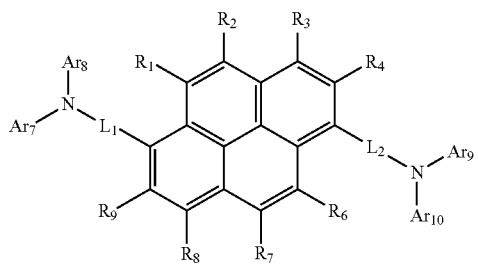

In the above Formula 2, $L_1$ and $L_2$ are each independently selected from hydrogen, deuterium, a substituted or unsubstituted C6-C30 arylene group and a substituted or unsubstituted C2-C30 heteroarylene group. $Ar_7$ to $Ar_{10}$ are each independently selected from hydrogen, deuterium, a substituted or unsubstituted C1-C20 alkyl group, a substituted or unsubstituted C3-C10 cycloalkyl group, a substituted or unsubstituted C6-C30 aryl group and a substituted or unsubstituted C2-C30 heteroaryl group. $R_1$ to $R_9$ are each independently selected from hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted C1-C20 alkyl group, a substituted or unsubstituted C2-C20 alkenyl group, a substituted or unsubstituted C2-C20 alkynyl group, a substituted or unsubstituted C1-C20 alkoxy group, a substituted or unsubstituted C3-C10 cycloalkyl group, a substi- tuted or unsubstituted C3-C10 cycloalkenyl group, a substituted or unsubstituted C1-C10 heterocycloalkyl group, a substituted or unsubstituted C2-C10 heterocycloalkenyl group, a substituted or unsubstituted C6-C30 aryl group, a substituted or unsubstituted C1-C30 heteroaryl group, a substituted or unsubstituted C6-C30 aryloxy group, a substituted or unsubstituted C6-C30 arylthio group and a monovalent C6-C30 non-aromatic condensed polycyclic group. $Ar_7$ and $Ar_8$ may be connected to each other to form a carbazole group, and $Ar_9$ and $Ar_{10}$ may be connected to each other to form a carbazole group.

In even further embodiments, the dopant may be represented by the following Formula 3.

Formula 3

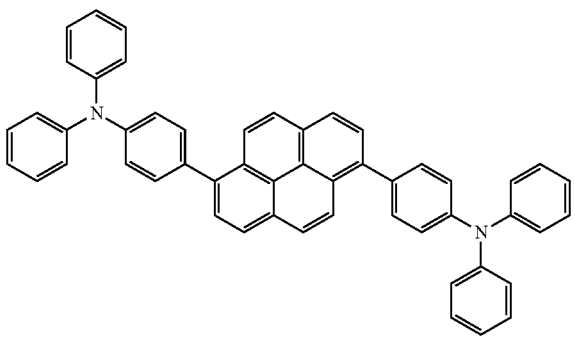

In yet further embodiments, the electron transport layer may include at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2) and 9,10-di(naphthalene-2-yl) anthracene (ADN).

In other embodiments of the inventive concept, a display device includes a plurality of pixels. At least one of the pixels includes a first electrode, a hole transport region on the first electrode, an emission layer on the hole transport region, an electron transport region on the emission layer, and a second electrode on the electron transport region. The electron transport region includes an electron transport layer on the emission layer, a first mixed electron transport layer on the electron transport layer, and a second mixed electron transport layer on the first mixed electron transport layer. The first mixed electron transport layer includes a first electron transport compound and a second electron transport compound different from the first electron transport compound mixed at a first ratio. The second mixed electron transport layer includes the first electron transport compound and the second electron transport compound mixed at a second ratio different from the first ratio.

In some embodiments, the first electron transport compound may be selected from compounds represented by the following Formula Group 1.

[Formula Group 1]

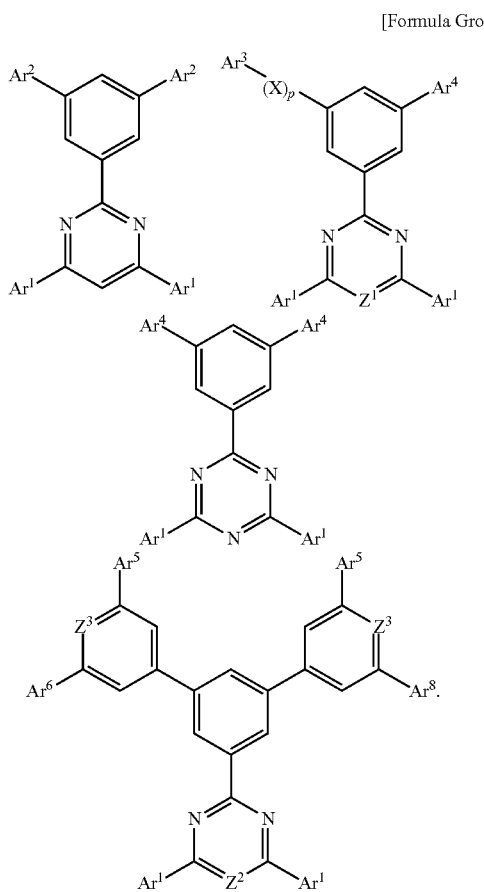

Formula 1

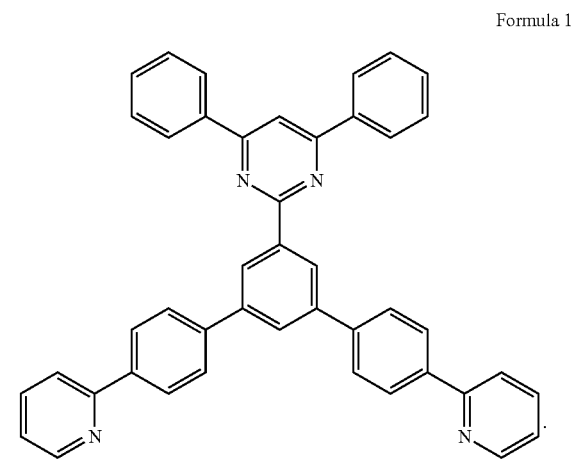 [SMILES: c1ccc(-c2cc(-c3ccccc3)nc(-c3cc(-c4ccc(-c5ccccn5)cc4)cc(-c4ccc(-c5ccccn5)cc4)c3)n2)cc1]

In even other embodiments, the electron transport layer may include the first electron transport compound.

In yet other embodiments, the second electron transport compound may be at least one of LiF, LiQ, Li$_2$O, BaO, NaCl, CsF, Yb, RbCl and RbI.

In further embodiments, the first ratio may be from about 3:7 to about 7:3, and the second ratio may be from about 4:6 to about 6:4.

In still further embodiments, the emission layer may include a dopant represented by the following Formula 2.

Formula 2

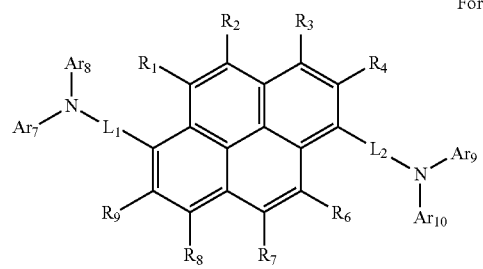

In the above Formula Group 1, Ar$^1$ to Ar$^6$ are each independently selected from the group consisting of hydrogen, deuterium, a substituted or unsubstituted aromatic group, a substituted or unsubstituted condensed aromatic group, a substituted or unsubstituted heteroaromatic group and a substituted or unsubstituted condensed heteroaromatic group, excluding a compound where Ar$^2$ is 1,3,5-trimethylphenyl group. X is a phenylene group or a pyridylene group. P is an integer from 0 to 2, where when P is 2, the two Xs may be the same or different. Z$^1$ to Z$^3$ are each independently C or N, excluding a compound where Z$^3$ is C and each of Ar$^5$ and Ar$^6$ is a phenyl group.

In other embodiments, Ar$^1$ may be selected from the group consisting of an aromatic group substituted with an alkyl group, a phenyl group or a pyridyl group; a condensed aromatic group substituted with an alkyl group, a phenyl group or a pyridyl group; a heteroaromatic group substituted with an alkyl group, a phenyl group or a pyridyl group; and a condensed heteroaromatic group substituted with an alkyl group, a phenyl group or a pyridyl group. Ar$^2$ may be a condensed phenyl group excluding a substituted or unsubstituted phenyl group or an element in group 16. Ar$^3$ may be a phenyl group, a pyridyl group or a pyrimidyl group. Ar$^4$ may be a substituted or unsubstituted aromatic group having two to four rings or a substituted or unsubstituted heteroaromatic group having two to four rings. Ar$^5$ and Ar$^6$ may be each independently a phenyl group or a pyridyl group.

In still other embodiments, the first electron transport compound may be represented by the following Formula 1.

In the above Formula 2, L$_1$ and L$_2$ are each independently selected from hydrogen, deuterium, a substituted or unsubstituted C6-C30 arylene group and a substituted or unsubstituted C2-C30 heteroarylene group. Ar$_7$ to Ar$_{10}$ are each independently selected from hydrogen, deuterium, a substituted or unsubstituted C1-C20 alkyl group, a substituted or unsubstituted C3-C10 cycloalkyl group, a substituted or unsubstituted C6-C30 aryl group and a substituted or unsubstituted C2-C30 heteroaryl group. R$_1$ to R$_9$ are each independently selected from hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted C1-C20 alkyl group, a substituted or unsubstituted C2-C20 alkenyl group, a substituted or unsubstituted C2-C20 alkynyl group, a substituted or unsubstituted C1-C20 alkoxy group, a substituted or unsubstituted C3-C10 cycloalkyl group, a substituted or unsubstituted C3-C10 cycloalkenyl group, a substituted or unsubstituted C1-C10 heterocycloalkyl group, a substituted or unsubstituted C2-C10 heterocycloalkenyl group, a substituted or unsubstituted C6-C30 aryl group, a substituted or unsubstituted C1-C30 heteroaryl group, a substituted or unsubstituted C6-C30 aryloxy group, a substituted or unsubstituted C6-C30 arylthio group and a monovalent C6-C30 non-aromatic condensed polycyclic group. $Ar_7$ and $Ar_8$ may be connected to each other to form a carbazole group, and $Ar_9$ and $Ar_{10}$ may be connected to each other to form a carbazole group.

In even further embodiments, the dopant may be represented by the following Formula 3.

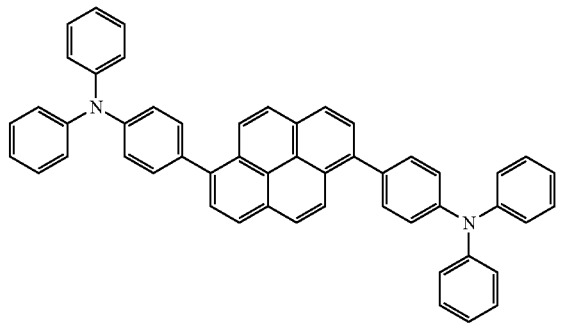

Formula 3

In yet further embodiments, the electron transport layer may include at least one of Alq3, TPBi, BCP, Bphen, TAZ, NTAZ, tBu-PBD, BAlq, Bebq2 and ADN.

In the organic light emitting device according to an embodiment of the inventive concept, efficiency changes with respect to temperature (in response to temperature changes) may be decreased (or reduced), and life time may be increased.

In the display device according to an embodiment of the inventive concept, efficiency changes with respect to the temperature may be decreased, and life time may be increased.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
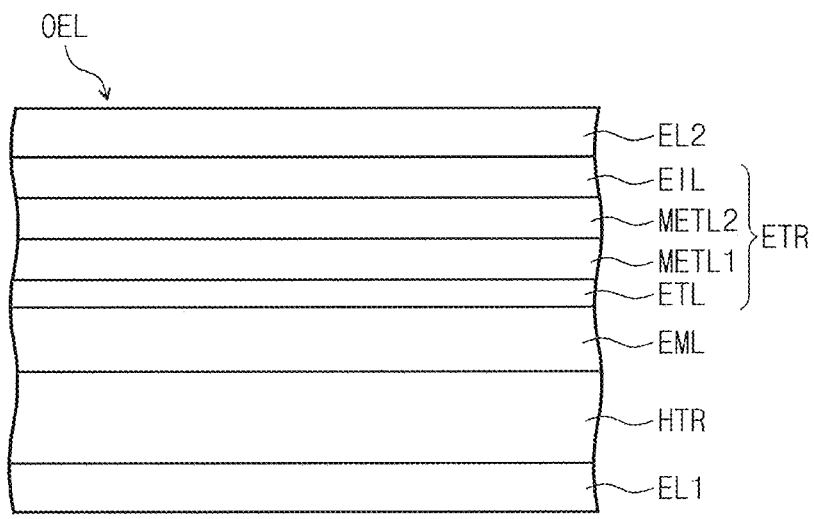
FIG. 1 is a cross-sectional view schematically illustrating an organic light emitting device according to an embodiment of the inventive concept.

The above objects, other objects, features and advantages of the inventive concept will be easily understood from example embodiments with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Like reference numerals refer to like elements for explaining each drawing. In the drawings, the sizes and relative sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, steps, operations, and/or devices, but do not preclude the presence or addition of one or more other features, steps, operations, and/or devices thereof. It will also be understood that when a layer, a film, a region, a plate, etc. is referred to as being "on" another part, it can be directly on the other part, or intervening layers may also be present. Further, when a layer, a film, a region, a plate, etc. is referred to as being "under" another part, it can be directly under the other part, or intervening layers may also be present.

Hereinafter, an organic light emitting device according to an embodiment of the inventive concept will be described in more detail.

FIG. 1 is a cross-sectional view schematically illustrating an organic light emitting device according to an embodiment of the inventive concept.

Figure 2:
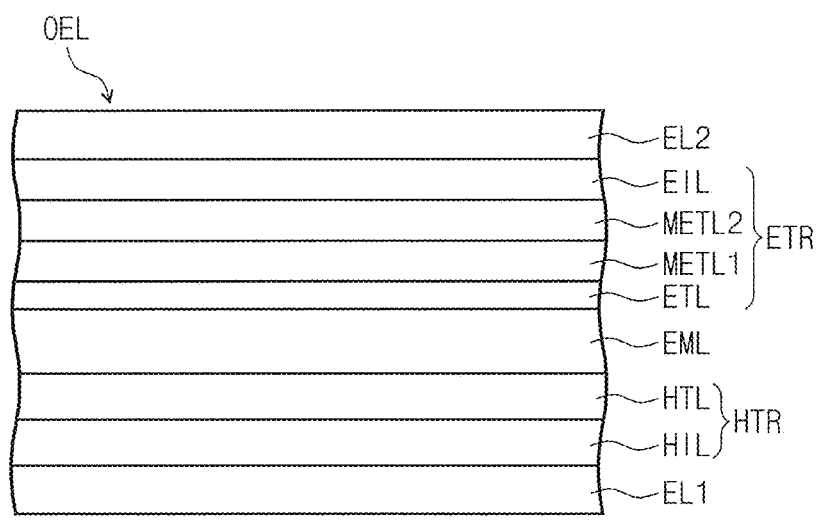
FIG. 2 is a cross-sectional view schematically illustrating an organic light emitting device according to an embodiment of the inventive concept.

FIG. 2 is a cross-sectional view schematically illustrating an organic light emitting device according to an embodiment of the inventive concept.

Referring to FIGS. 1 and 2, an organic light emitting device OEL according to an embodiment of the inventive concept includes a first electrode EL1, a hole transport region HTR, an emission layer EML, an electron transport region ETR and a second electrode EL2.

The first electrode EL1 has conductivity (i.e., electrical conductivity). The first electrode EL1 may be a pixel electrode or an anode. The first electrode EL1 may be formed as a transmission electrode, a transflective electrode or a reflection electrode. When the first electrode EL1 is formed as the transmission electrode, the first electrode EL1 may be formed utilizing a transparent metal oxide, for example, indium tin oxide (ITO), indium zinc oxide (IZO), zinc oxide (ZnO), indium tin zinc oxide (ITZO), etc. When the first electrode EL1 is formed as the transflective electrode or the reflection electrode, the first electrode EL1 may include Ag, Mg, Al, Pt, Pd, Au, Ni, Nd, Ir, Cr or a mixture of these metals.

On the first electrode EL1, an organic layer may be disposed. The organic layer includes the emission layer EML. The organic layer may further include the hole transport region HTR and the electron transport region ETR.

The hole transport region HTR may be provided on the first electrode EL1. The hole transport region HTR may include at least one of a hole injection layer HIL, a hole transport layer HTL, a buffer layer and an electron blocking layer.

The hole transport region HTR may have a single layer (i.e., a single-layered structure) formed utilizing a single material, a single layer formed utilizing a plurality of different materials or a multilayered structure including a plurality of layers formed utilizing a plurality of different materials.

For example, the hole transport region HTR may have the structure of a single layer formed utilizing a plurality of different materials; or a laminated structure (from the first electrode EL1) of hole injection layer HIL/hole transport layer HTL, hole injection layer HIL/hole transport layer HTL/buffer layer, hole injection layer HIL/buffer layer, hole transport layer HTL/buffer layer or hole injection layer HIL/hole transport layer HTL/electron blocking layer, without being limited thereto.

The hole transport region HTR may be formed utilizing various suitable methods such as a vacuum evaporation method, a spin coating method, a cast method, a Langmuir-Blodgett (LB) method, an inkjet printing method, a laser printing method, a laser induced thermal imaging (LITI) method, etc.

When the hole transport region HTR includes the hole injection layer HIL, the hole transport region HTR may include a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-tris(N,N-diphenylamino)triphenylamine (TDATA), 4,4',4''-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), etc., without being limited thereto.

When the hole transport region HTR includes the hole transport layer HTL, the hole transport region HTR may include a carbazole derivative (such as N-phenylcarbazole or polyvinyl carbazole), a fluorine-based derivative, N,N'-bis(3-methylphenyl)-N,N'-diphenyl-[1,1-biphenyl]-4,4'-diamine (TPD), a triphenylamine-based derivative (such as 4,4',4''-tris(N-carbazolyl)triphenylamine) (TCTA)), N,N'-di(1-naphthyl)-N,N'-diphenylbenzidine (NPB), 4,4'-cyclohexylidene bis[N,N-bis(4-methylphenyl)benzeneamine] (TAPC), etc., without being limited thereto.

The thickness of the hole transport region HTR may be from about 100 Å to about 10,000 Å, for example, from about 100 Å to about 1,000 Å. In one embodiment, when the hole transport region HTR includes both the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 50 Å to about 2,000 Å, for example, from about 100 Å to about 1,500 Å. In one embodiment, when the thicknesses of the hole transport region HTR, the hole injection layer HIL and the hole transport layer HTL satisfy the above-described ranges, satisfactory hole transport properties are obtained without any substantial increase of a driving voltage.

The hole transport region HTR may further include a charge generating material other than the above-described materials to improve conductivity. The charge generating material may be dispersed in the hole transport region HTR uniformly or non-uniformly. The charge generating material may be, for example, a p-dopant. The p-dopant may be one of a quinone derivative, a metal oxide and a cyano group-containing compound, without being limited thereto. For example, non-limiting examples of the p-dopant may include a quinone derivative (such as tetracyanoquinodimethane (TCNQ), 2,3,5,6-tetrafluoro-tetracyanoquinodimethane (F4-TCNQ), etc.), and/or a metal oxide (such as tungsten oxide, molybdenum oxide, etc.), without being limited thereto.

As described above, the hole transport region HTR may further include one of the buffer layer and the electron blocking layer other than the hole injection layer HIL and the hole transport layer HTL. The buffer layer may compensate an optical resonance range according to the wavelength of light emitted from the emission layer EML and increase the light emission efficiency. Materials included in the hole transport region HTR may be utilized as materials included in the buffer layer. The electron blocking layer is a layer for reducing or preventing electron injection from the electron transport region ETR to the hole transport region HTR.

The emission layer EML may be provided on the hole transport region HTR. The emission layer EML may have a single layer (i.e., a single-layered structure) formed utilizing a single material, a single layer formed utilizing a plurality of different materials, or a multilayered structure including a plurality of layers formed utilizing a plurality of different materials.

The emission layer EML may be formed by utilizing various suitable methods such as a vacuum evaporation method, a spin coating method, a cast method, an LB method, an inkjet printing method, a laser printing method, an LITI method, etc.

The emission layer EML may be formed utilizing a commonly utilized suitable material without specific limitations, and for example, may be formed utilizing a material emitting red, green or blue light, and may include a phosphorescent material or a fluorescent material. In addition, the emission layer EML may include a host and/or a dopant.

The host may be any suitable material commonly utilized without specific limitations and may include, e.g., Alq3, 4,4'-bis(N-carbazolyl)-1,1'-biphenyl (CBP), poly(n-vinylcarbazole) (PVK), ADN, TCTA, TPBi, 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

When the emission layer EML emits red light, the emission layer EML may further include a phosphorescent material including, for example, tris(dibenzoylmethanato) phenanthoroline europium (PBD:Eu(DBM)3(Phen)) or perylene. When the emission layer EML emits red light, the dopant further included in the emission layer EML may be selected from a metal complex and an organometallic complex (such as bis(1-phenylisoquinoline)acetylacetonate iridium (PIQIr(acac)), bis(1-phenylquinoline)acetylacetonate iridium (PQIr(acac), tris(1-phenylquinoline)iridium (PQIr) or octaethylporphyrin platinum (PtOEP)).

When the emission layer EML emits green light, the emission layer EML may further include a phosphorescent material including, for example, Alq3. When the emission layer EML emits green light, the dopant further included in the emission layer EML may be selected from a metal complex and an organometallic complex (such as fac-tris (2-phenylpyridine)iridium (Ir(ppy)3)).

When the emission layer EML emits blue light, the emission layer EML may further include a phosphorescent material including at least one selected from, for example, spiro-DPVBi (DPVBi), spiro-6P, distyryl-benzene (DSB), DSA, a polyfluorene (PFO)-based polymer and a poly(p-phenylene vinylene) (PPV)-based polymer. When the emission layer EML emits blue light, the dopant further included in the emission layer EML may be selected from a metal complex and an organometallic complex (such as (4,6-F2ppy)$_2$Irpic).

The emission layer EML may include a dopant represented by the following Formula 2.

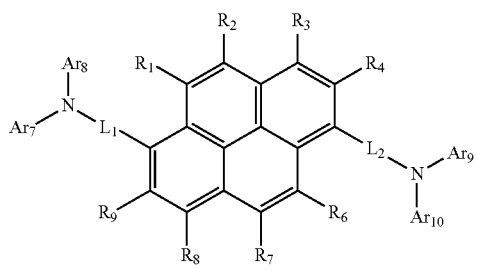

Formula 2

In the above Formula 2, $L_1$ and $L_2$ are each independently selected from hydrogen, deuterium, a substituted or unsubstituted C6-C30 arylene group and a substituted or unsubstituted C2-C30 heteroarylene group. $Ar_7$ to $Ar_{10}$ are each independently selected from hydrogen, deuterium, a substituted or unsubstituted C1-C20 alkyl group, a substituted or unsubstituted C3-C10 cycloalkyl group, a substituted or unsubstituted C6-C30 aryl group and a substituted or unsubstituted C2-C30 heteroaryl group. $Ar_7$ and $Ar_8$ may be connected to each other to form a carbazole group, and $Ar_9$ and $Ar_{10}$ may be connected to each other to form a carbazole group. $R_1$ to $R_9$ are each independently selected from hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted C1-C20 alkyl group, a substituted or unsubstituted C2-C20 alkenyl group, a substituted or unsubstituted C2-C20 alkynyl group, a substituted or unsubstituted C1-C20 alkoxy group, a substituted or unsubstituted C3-C10 cycloalkyl group, a substituted or unsubstituted C3-C10 cycloalkenyl group, a substituted or unsubstituted C1-C10 heterocycloalkyl group, a substituted or unsubstituted C2-C10 heterocycloalkenyl group, a substituted or unsubstituted C6-C30 aryl group, a substituted or unsubstituted C1-C30 heteroaryl group, a substituted or unsubstituted C6-C30 aryloxy group, a substituted or unsubstituted C6-C30 arylthio group and a monovalent C6-C30 non-aromatic condensed polycyclic group.

The dopant may be a compound represented by the following Formula 3.

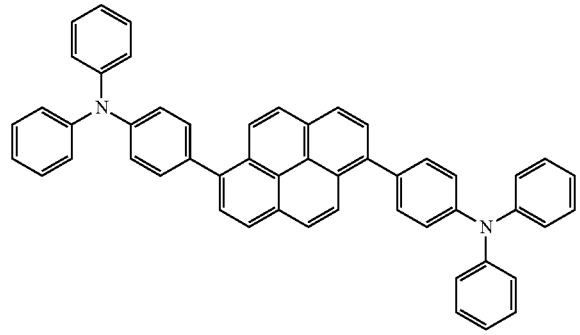

Formula 3

The electron transport region ETR may be provided on the emission layer EML. The electron transport region ETR may be formed by utilizing various suitable methods such as a vacuum evaporation method, a spin coating method, a cast method, an LB method, an inkjet printing method, a laser printing method, an LITI method, etc.

The electron transport region ETR may include an electron transport layer ETL, a first mixed electron transport layer METL1 and a second mixed electron transport layer METL2. The electron transport layer ETL may be provided on the emission layer EML.

The electron transport layer ETL may include at least one of, e.g., Alq3, TPBi, BCP, Bphen, TAZ, NTAZ, tBu-PBD, BAlq, Bebq2 and ADN.

The thickness of the electron transport layer ETL may be from about 40 Å to about 60 Å. The lowest unoccupied molecular orbital (LUMO) value of the electron transport layer ETL may be greater than the LUMO value of the first mixed electron transport layer METL1 by about −0.2 eV and above (i.e., about −0.2 eV or greater). Thus, the electron transport layer ETL may reduce or prevent the injection of holes into the electron transport region ETR.

The electron transport layer ETL may include a first electron transport compound included in each of the first mixed electron transport layer METL1 and the second mixed electron transport layer METL2. The first electron transport compound will be explained in more detail hereinafter.

The first mixed electron transport layer METL1 may be provided on the electron transport layer ETL. The first mixed electron transport layer METL1 may include the first electron transport compound and the second electron transport compound mixed at a first ratio. The second mixed electron transport layer METL2 may be provided on the first mixed electron transport layer METL1. The second mixed electron transport layer METL2 may include the first electron transport compound and the second electron transport compound mixed at a second ratio which is different from the first ratio. The sum of the thicknesses of the first mixed electron transport layer METL1 and the second mixed electron transport layer METL2 may be from about 310 Å to about 360 Å.

The first electron transport compound may transport the electrons of the electron transport region ETR to the emission layer EML. The first electron transport compound may be selected from compounds represented by the following Formula Group 1.

Formula Group 1

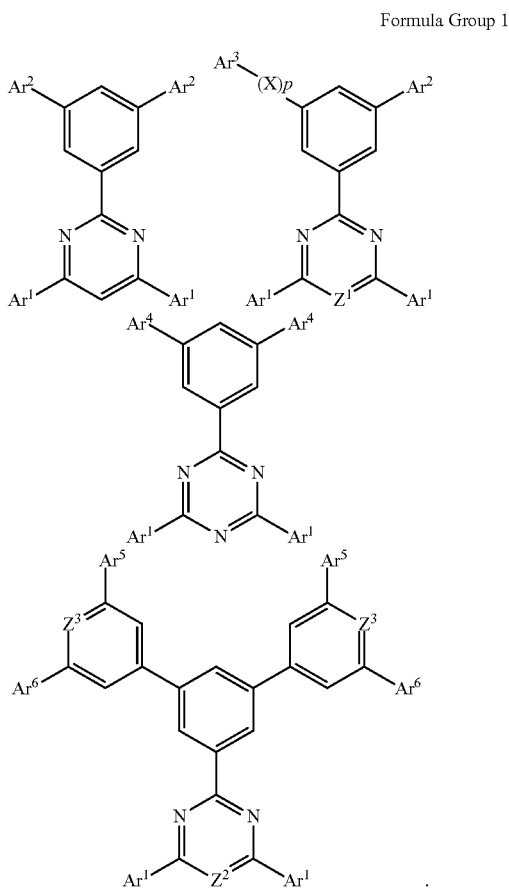

In the above Formula Group 1, $Ar^1$ to $Ar^6$ are each independently selected from hydrogen, deuterium, a substituted or unsubstituted aromatic group, a substituted or unsubstituted condensed aromatic group, a substituted or unsubstituted heteroaromatic group and a substituted or unsubstituted condensed heteroaromatic group, excluding a compound where $Ar^2$ is 1,3,5-trimethylphenyl group. X is a phenylene group or a pyridylene group. P is an integer from 0 to 2, where in the case that P is 2, the two Xs may be the same or different. $Z^1$ to $Z^3$ are each independently C or N, excluding a compound where $Z^3$ is C and each of $Ar^5$ and $Ar^6$ is a phenyl group.

$Ar^1$ may be selected from an aromatic group substituted with an alkyl group, a phenyl group or a pyridyl group; a condensed aromatic group substituted with an alkyl group, a phenyl group or a pyridyl group; a heteroaromatic group substituted with an alkyl group, a phenyl group or a pyridyl group; and a condensed heteroaromatic group substituted with an alkyl group, a phenyl group or a pyridyl group. $Ar^2$ may be a condensed phenyl group excluding a substituted or unsubstituted phenyl group or an element in group 16. $Ar^3$ may be a phenyl group, a pyridyl group or a pyrimidyl group. $Ar^4$ may be a substituted or unsubstituted aromatic group having two to four rings or a substituted or unsubstituted heteroaromatic group having two to four rings. $Ar^5$ and $Ar^6$ may be each independently a phenyl group or a pyridyl group.

The first electron transport compound may be represented by the following Formula 1.

Formula 1

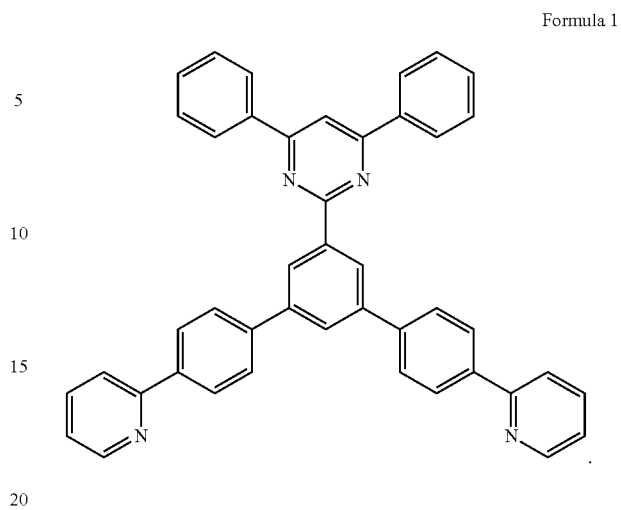

The first ratio may be from about 3:7 to about 7:3, and the second ratio may be from about 4:6 to about 6:4. In the case that the first ratio and the second ratio are in the above-mentioned ranges, the efficiency may not change according to the temperature (i.e., the emission efficiency may not change significantly when the temperature changes), and long life time may be realized. However, in the case that the first ratio and the second ratio are deviated from the above-mentioned ranges, the efficiency according to temperature may not be maintained constant (i.e., the emission efficiency may not be maintained at a constant value when the temperature changes), and long life time may not be realized.

The second electron transport compound may be different from the first electron transport compound. The second electron transport compound may reduce or prevent the injection of holes from the emission layer EML to the electron transport region ETR according to the ratio with respect to the first electron transport compound, and decrease the energy gap between the first electron transport compound and a compound included in the electron injection layer EIL, thereby facilitating electron transport from the electron injection layer EIL to the second mixed electron transport layer METL2.

The second electron transport compound may be at least one of, e.g., LiF, LiQ, Li$_2$O, BaO, NaCl, CsF, Yb, RbCl and RbI.

The electron transport region ETR may further include at least one of an electron injection layer EIL and a hole blocking layer.

When the electron transport region ETR includes the electron injection layer EIL, the electron transport region ETR may further include LiF, LiQ, Li$_2$O, BaO, NaCl, CsF, a metal in lanthanoides (such as Yb), and/or a metal halide (such as RbCl or RbI), without being limited thereto. The electron injection layer EIL also may be formed utilizing a mixture material (i.e., a mixture) of the hole transport material and an insulating organo metal salt. The organo metal salt may be a material having an energy band gap of greater than or equal to about 4 eV. For example, the organo metal salt may include, a metal acetate, a metal benzoate, a metal acetoacetate, a metal acetylacetonate or a metal stearate. The thickness of the electron injection layer EIL may be from about 1 Å to about 100 Å, for example, from about 3 Å to about 90 Å. In one embodiment, when the thickness of the electron injection layer EIL satisfies the above described ranges, satisfactory electron injection properties are obtained without inducing any substantial increase of a driving voltage.

The electron transport region ETR may include a hole blocking layer, as described above. The hole blocking layer may include at least one of, for example, BCP and Bphen, without being limited thereto. The thickness of the hole blocking layer may be from about 20 Å to about 1,000 Å, for example, from about 30 Å to about 300 Å. In one embodiment, when the thickness of the hole blocking layer satisfies the above described ranges, satisfactory hole blocking properties are obtained without inducing any substantial increase of a driving voltage.

The second electrode EL2 may be provided on the electron transport region ETR. The second electrode EL2 may be a common electrode or a cathode. The second electrode EL2 may be a transmission electrode, transflective electrode or reflection electrode.

When the second electrode EL2 is the transmission electrode, the second electrode EL2 may include Li, Ca, LiF/Ca, LiF/Al, Al, Mg, BaF, Ba, Ag, a compound thereof or a mixture thereof (for example, a mixture of Ag and Mg).

The second electrode EL2 may include an auxiliary electrode. The auxiliary electrode may include a layer formed by evaporating the above-described material toward an emission layer, a transparent metal oxide on the layer, for example, ITO, IZO, ZnO, ITZO, Mo and Ti, etc. (e.g., the auxiliary layer may include a first layer formed on the emission layer by evaporating the above-described material for the second electrode toward the emission layer, and a transparent metal oxide formed on the first layer utilizing a transparent metal oxide).

When the second electrode EL2 is the transflective electrode or the reflection electrode, the second electrode EL2 may include Ag, Mg, Al, Pt, Pd, Au, Ni, Nd, Ir, Cr, Li, Ca, LiF/Ca, LiF/Al, Mo, Ti, a compound thereof or a mixture thereof (for example, a mixture of Ag and Mg). The second electrode EL2 may be a reflective layer or a transflective layer formed utilizing the above materials, and a multilayered structure including (e.g., further including) a transparent conductive layer formed utilizing ITO, IZO, ZnO, ITZO, etc.

When the organic light emitting device OEL is a front luminescent device, the first electrode EL1 may be the reflection electrode, and the second electrode EL2 may be the transmission electrode or the transflective electrode. When the organic light emitting device OEL is a backside luminescent device, the first electrode EL1 may be the transmission electrode or the transflective electrode, and the second electrode EL2 is the reflection electrode.

In the organic light emitting device OEL according to an embodiment of the inventive concept, according to the application of a voltage to the first electrode EL1 and the second electrode EL2, respectively, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light is emitted during the transition of the excitons from an excited state to a ground state.

Even though not shown, an organic capping layer may be provided on the second electrode EL2. The organic capping layer may reflect emitted lights from the emission layer EML at the top surface of the organic capping layer toward the emission layer EML. The reflected lights may be amplified by resonance effect in an organic layer to increase the light efficiency of a display device 10. In the front luminescent organic light emitting device, the organic capping layer may reduce or prevent the loss of lights at the second electrode EL2 via the total reflection of lights.

The organic capping layer may include any suitable material commonly utilized without specific limitation, e.g., at least one of N4,N4,N4',N4'-tetra(biphenyl-4-yl)biphenyl-4,4'-diamine (TPD15), TCTA, and N,N'-bis(naphthalen-1-yl), N,N'-bis(phenyl)-2,2'-dimethylbenzidine (α-NPD).

The organic capping layer may have refractive index in a range from about 1.6 to about 2.4. In the case that the refractive index of the organic capping layer is smaller than 1.6, light emitted from the emission layer EML may be insufficiently reflected at the top surface of the organic capping layer toward the emission layer EML, and the amount of light which may be amplified by resonance effect may decrease. Thus, the light efficiency of the organic light emitting device OEL may decrease. In the case that the refractive index of the organic capping layer is greater than about 2.4, light emitted from the emission layer EML may be excessively reflected at the top surface of the organic capping layer toward the emission layer EML, and the amount of light passing through the organic capping layer for displaying images may decrease.

Generally, the moving velocity of electrons is smaller (lower) than that of holes in an organic light emitting device, and a band gap between the energy band of a hole transport region and the energy band of an emission layer and a band gap between the energy band of the emission layer and the energy band of an electron transport region may be generated. Thus, the injection of the holes and electrons into the emission layer may not be easy, and the probability of the recombination of the electrons and the holes in the emission layer may be low, thereby deteriorating emission efficiency. In addition, the change of efficiency may be large according to the change of temperature, and the realization of long life time may be difficult.

The organic light emitting device according to an embodiment of the inventive concept includes an electron transport layer, a first mixed electron transport layer including a first electron transport compound and a second electron transport compound mixed at a first ratio, and a second mixed electron transport layer including the first electron transport compound and the second electron transport compound mixed at a second ratio. Thus, the band gap between the energy band of the hole transport region and the energy band of the emission layer may be decreased, and the hole injection into the emission layer may become relatively easy in the organic light emitting device. In addition, the band gap between the energy band of the emission layer and the energy band of the electron transport region may be decreased, and the electron injection into the emission layer may become relatively easy. Accordingly, high efficiency and long life time may be realized in the organic light emitting device according to an embodiment of the inventive concept. Further, efficiency (i.e., emission efficiency) change according to temperature change is not too great (i.e., the emission efficiency does not change significantly when the temperature changes) and long life time may be realized in the organic light emitting device according to an embodiment of the inventive concept.

Hereinafter, a display device according to an embodiment of the inventive concept will be explained. The explanation will be concentrated on different points from the organic light emitting device OEL according to an embodiment of the inventive concept described above, and unexplained parts will follow the explanation on the organic light emitting device OEL according to an embodiment of the inventive concept described above.

Figure 3:
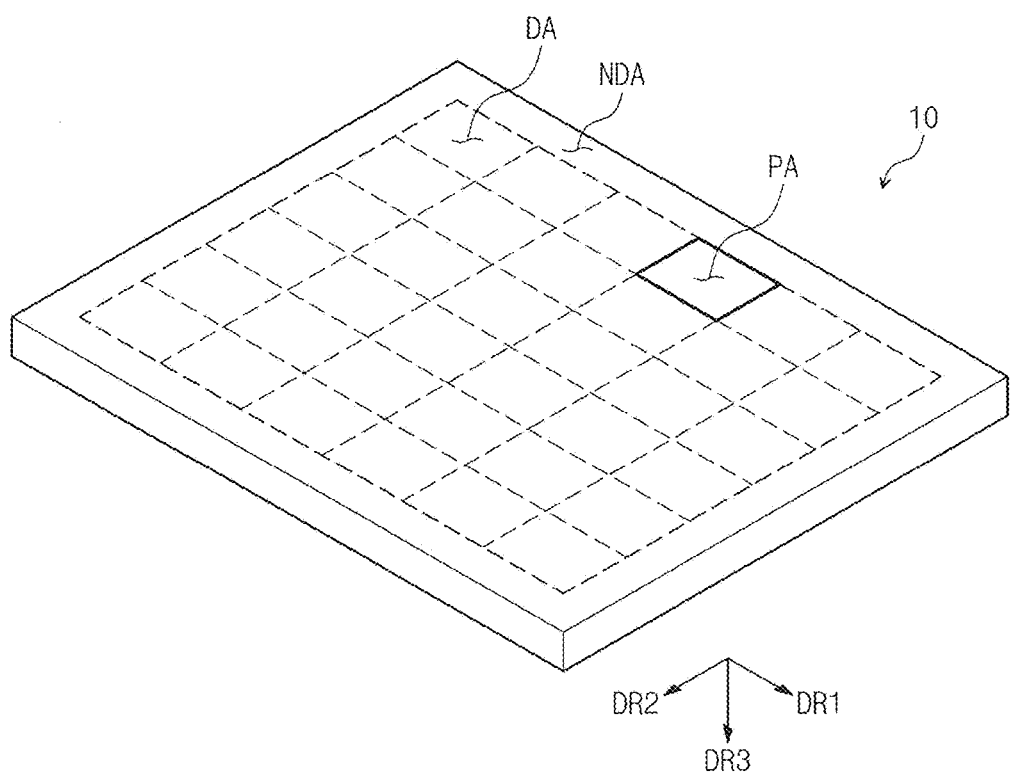
FIG. 3 is a perspective view schematically illustrating a display device according to an embodiment of the inventive concept.

FIG. 3 is a perspective view schematically illustrating a display device 10 according to an embodiment of the inventive concept.

Referring to FIG. 3, a display device 10 according to an embodiment of the inventive concept includes a display area DA and a non-display area NDA.

The display area DA displays an image. When seen from the direction of the thickness of the display device 10 (for example, in DR3), the display area DA may have approximately a rectangle shape. However, the shape is not limited thereto.

The display area DA includes a plurality of pixel areas PA. The pixel areas PA may be disposed in a matrix shape. The pixel areas PA may be defined by a pixel defining layer (PDL in FIG. 6). Each pixel area PA may include a plurality of pixels (PX in FIG. 4).

A non-display area NDA does not display an image. When seen from the direction of the thickness of the display device 100 (in DR3), the non-display area NDA may, for example, surround the display area DA. The non-display area NDA may be adjacent to the display area DA in a first direction (for example, in DR1) and a second direction (for example, in DR2) which crosses (for example, is perpendicular to) the first direction (for example, DR1).

Figure 4:
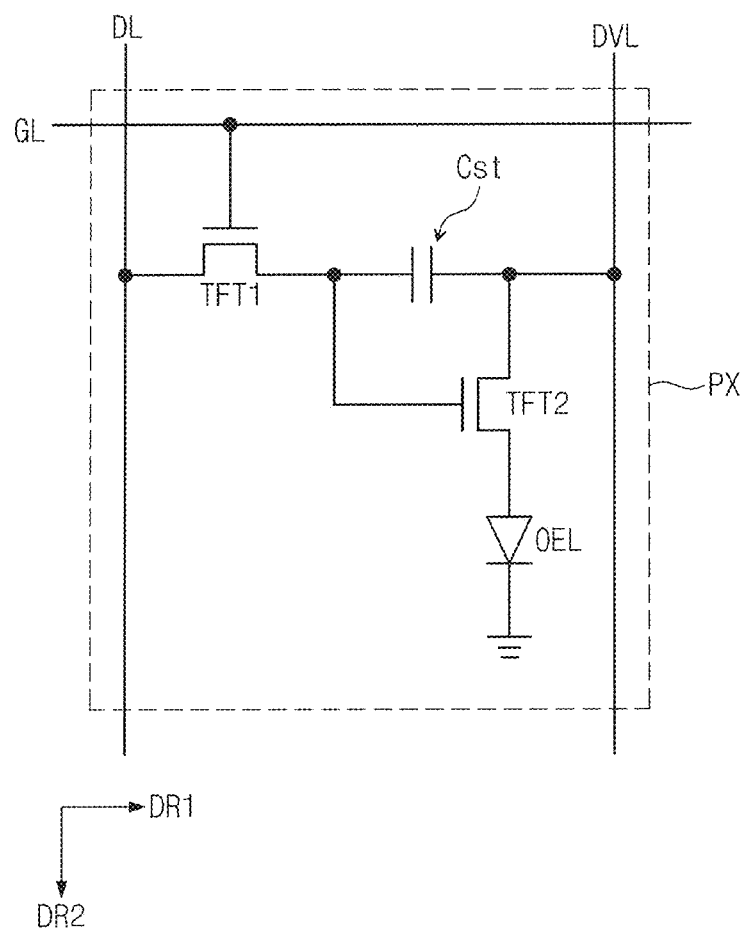
FIG. 4 is a circuit diagram of one pixel included in a display device according to an embodiment of the inventive concept.

FIG. 4 is a circuit diagram of a pixel included in a display device 10 according to an embodiment of the inventive concept.

Figure 5:
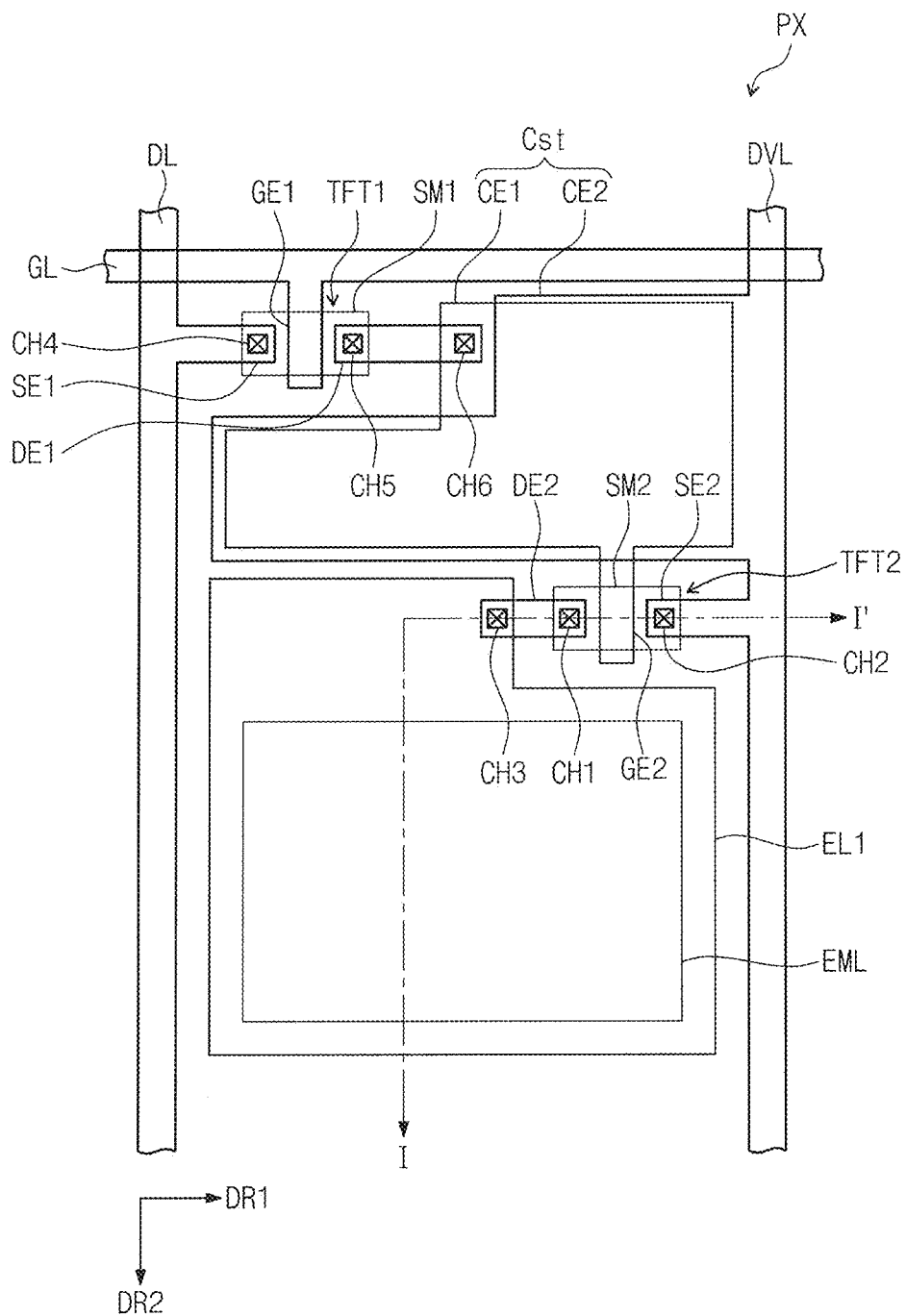
FIG. 5 is a plan view illustrating one pixel included in a display device according to an embodiment of the inventive concept.

FIG. 5 is a plan view of a pixel included in a display device 10 according to an embodiment of the inventive concept.

Figure 6:
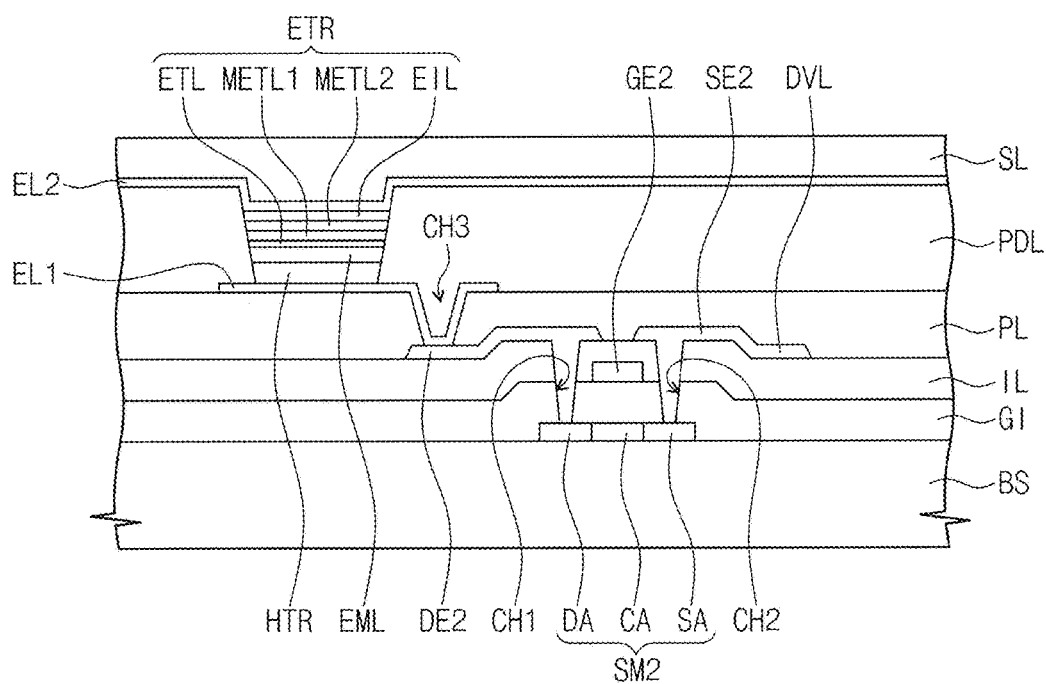
FIG. 6 is a schematic cross-sectional view taken along the line. I-I' of FIG. 5.

FIG. 6 is a schematic cross-sectional view corresponding to line I-I' in FIG. 5.

Referring to FIGS. 4 to 6, each pixel PX includes a wire part including a gate line GL, a data line DL and a driving voltage line DVL, thin film transistors TFT1 and TFT2 connected to the wire part, an organic light emitting device OEL connected to the thin film transistors TFT1 and TFT2, and a capacitor Cst.

Each pixel may emit light having a specific color, for example, one of red light, green light and blue light. The kind of color light is not limited thereto, and may further include, for example, cyan light, magenta light, yellow light, etc.

The gate line GL is extended in the first direction DR1. The data line DL is extended in the second direction DR2 crossing the gate line GL. The driving voltage line DVL is extended in substantially the same direction as the data line DL, i.e., the second direction DR2. The gate line GL transmits scanning signals to the thin film transistors TFT1 and TFT2, and the data line DL transmits data signals to the thin film transistors TFT1 and TFT2, and the driving voltage line DVL provides a driving voltage to the thin film transistors.

The thin film transistors TFT1 and TFT2 may include a driving thin film transistor TFT2 for controlling the organic light emitting device OEL and a switching thin film transistor TFT1 for switching the driving thin film transistor TFT2. In an embodiment of the inventive concept, each pixel PX includes two thin film transistors TFT1 and TFT2, however the inventive concept is not limited thereto. Each pixel PX may include one thin film transistor and one capacitor, or each pixel PX may include at least three thin film transistors and at least two capacitors.

The switching thin film transistor TFT1 includes a first gate electrode GE1, a first source electrode SE1 and a first drain electrode DE1. The first gate electrode GE1 is connected to the gate line GL, and the first source electrode SE1 is connected to the data line DL. The first drain electrode DE1 is connected to a first common electrode CE1 via a fifth contact hole CH5. The switching thin film transistor TFT1 transmits data signals applied to the data line DL to the driving thin film transistor TFT2 according to scanning signal applied to the gate line GL.

The driving thin film transistor TFT2 includes a second gate electrode GE2, a second source electrode SE2 and a second drain electrode DE2. The second gate electrode GE2 is connected to the first common electrode CE1. The second source electrode SE2 is connected to the driving voltage line DVL. The second drain electrode DE2 is connected to the first electrode EL1 by a third contact hole CH3.

The first electrode EL1 is connected to a second drain electrode DE2 of the driving thin film transistor TFT2. To the second electrode EL2, a common voltage is applied, and the emission layer EML emits blue light according to the output signals of the driving thin film transistor TFT2, thereby displaying images. The first electrode EL1 and the second electrode EL2 will be particularly described below.

The capacitor Cst is connected between the second gate electrode GE2 and the second source electrode SE2 of the driving thin film transistor TFT2 and charges and maintains data signals input to the second gate electrode GE2 of the driving thin film transistor TFT2. The capacitor Cst may include the first common electrode CE1 connected to the first drain electrode DE1 via a sixth contact hole CH6 and a second common electrode CE2 connected to the driving voltage line DVL.

Referring to FIGS. 5 and 6, the display device 10 according to an embodiment of the inventive concept may include a base substrate BS on which a thin film transistor and the organic light emitting device OEL are stacked. Any suitable commonly utilized substrates may be utilized as the base substrate BS, without being limited thereto, and may be formed utilizing an insulating material, for example, glass, plastics, quartz, etc. As an organic polymer forming the base substrate BS, polyethylene terephthalate (PET), polyethylene naphthalate (PEN), polyimide, polyethersulfone, etc. may be utilized. The base substrate BS may be selected in consideration of mechanical strength, thermal stability, transparency, surface smoothness, easiness of handling, water-proof properties, etc.

On the base substrate BS, a substrate buffer layer may be provided. The substrate buffer layer reduces or prevents the diffusion of impurities into the switching thin film transistor TFT1 and the driving thin film transistor TFT2. The substrate buffer layer may be formed utilizing silicon nitride (SiNx), silicon oxide (SiOx), silicon oxynitride (SiOxNy), etc., and may be omitted according to the material of the substrate BS and process conditions.

On the base substrate BS, a first semiconductor layer SM1 and a second semiconductor layer SM2 are provided. The first semiconductor layer SM1 and the second semiconductor layer SM2 are formed utilizing a semiconductor material and function as an active layer of a switching thin film transistor TFT1 and a driving thin film transistor TFT2, respectively. Each of the first semiconductor layer SM1 and the second semiconductor layer SM2 includes a source area SA, a drain area DA and a channel area CA provided between the source area SA and the drain area DA. Each of the first semiconductor layer SM1 and the second semiconductor layer SM2 may be formed by an inorganic semiconductor and/or an organic semiconductor. The source area SA and the drain area DA may be doped with n-type impurities (n-dopants) or p-type impurities (p-dopants).

On the first semiconductor layer SM1 and the second semiconductor layer SM2, a gate insulating layer GI is provided. The gate insulating layer GI covers the first semiconductor layer SM1 and the second semiconductor layer SM2. The gate insulating layer GI may be formed utilizing an organic insulating material and/or an inorganic insulating material.

On the gate insulating layer GI, a first gate electrode GE1 and a second gate electrode GE2 are provided. Each of the first gate electrode GE1 and the second gate electrode GE2 are formed to cover a corresponding area in the channel area CA of the first semiconductor layer SM1 and the second semiconductor layer SM2.

On the first gate electrode GE1 and the second gate electrode GE2, an insulating interlayer IL is provided. The insulating interlayer IL covers the first gate electrode GE1 and the second gate electrode GE2. The insulating interlayer IL may be formed utilizing an organic insulating material and/or an inorganic insulating material.

On the insulating interlayer IL, a first source electrode SE1, a first drain electrode DE1; a second source electrode SE2 and a second drain electrode DE2 are provided. The second drain electrode DE2 makes a contact with the drain area DA of the second semiconductor layer SM2 via a first contact hole CH1 formed in a gate insulating layer GI and the insulating interlayer IL, and the second source electrode SE2 makes a contact with the source area SA of a second semiconductor layer SM2 by a second contact hole CH2 formed in the gate insulating layer GI and the insulating interlayer IL. The first source electrode SE1 makes a contact with the source area of the first semiconductor layer SM1 via a fourth contact hole CH4 formed in the gate insulating layer GI and the insulating interlayer IL, and the first drain electrode DE1 makes a contact with the drain area of the first semiconductor layer SM1 by a fifth contact hole CH5 formed in the gate insulating layer GI and the insulating interlayer IL.

On the first source electrode SE1, the first drain electrode DE1, the second source electrode SE2 and the second drain electrode DE2, a passivation layer PL is provided. The passivation layer PL may play the role of the switching of the thin film transistor TFT1 and the driving of the thin film transistor TFT2, or the role as a planarization layer for planarizing the top surfaces thereof.

On the passivation layer PL, a first electrode EL1 is provided. The first electrode EL1 may be, for example, an anode. The first electrode EL1 is connected to the second drain electrode DE2 of the driving thin film transistor TR2 via the third contact hole CH3 formed in the passivation layer PL.

On the passivation layer PL, a pixel defining layer PDL for partitioning pixel areas (PA in FIG. 3) corresponding to each of the pixels PX is provided. The pixel defining layer PDL exposes the top surface of the first electrode EL1 and is extruded from the base substrate BS along the circumference of each of the pixels PX. The pixel defining layer PDL may include a metal fluoride ion compound, without being limited thereto. For example, the pixel defining layer PDL may be formed utilizing one metal fluoride ion compound of $LiF$, $BaF_2$ and $CsF$. When the metal fluoride ion compound has a certain thickness, insulating properties are obtained. The thickness of the pixel defining layer PDL may be, for example, from about 10 nm to about 100 nm.

To each pixel area (PA in FIG. 3) surrounded by the pixel defining layer PDL, an organic light emitting device OEL is provided. The organic light emitting device OEL includes a first electrode EL1, a hole transport region HTR, an emission layer EML, an electron transport region ETR and a second electrode EL2.

The first electrode EL1 has conductivity (i.e., electrical conductivity). The first electrode EL1 may be a pixel electrode or an anode. The first electrode EL1 may be formed as a transmission electrode, a transflective electrode or a reflection electrode. When the first electrode EL1 is formed as the transmission electrode, the first electrode EL1 may be formed utilizing a transparent metal oxide, for example, ITO, IZO, ZnO, ITZO, etc. When the first electrode EL1 is formed as the transflective electrode or the reflection electrode, the first electrode EL1 may include Ag, Mg, Al, Pt, Pd, Au, Ni, Nd, Ir, Cr or a mixture of these metals.

On the first electrode EL1, an organic layer may be disposed. The organic layer includes the emission layer EML. The organic layer may further include the hole transport region HTR and the electron transport region ETR.

The hole transport region HTR may be provided on the first electrode EL1. The hole transport region HTR may include at least one of a hole injection layer HIL, a hole transport layer HTL, a buffer layer and an electron blocking layer.

The hole transport region HTR may have a single layer formed by utilizing a single material, a single layer formed by utilizing a plurality of different materials, or a multilayered structure including a plurality of layers formed by utilizing a plurality of different materials.

For example, the hole transport region HTR may have the structure of a single layer formed by utilizing a plurality of different materials, or a laminated structure from the first electrode EL1, of hole injection layer HIL/hole transport layer HTL, hole injection layer HIL/hole transport layer HTL/buffer layer, hole injection layer HIL/buffer layer, hole transport layer HTL/buffer layer or hole injection layer HIL/hole transport layer HTL/electron blocking layer, without being limited thereto.

The hole transport region HTR may be formed by utilizing various suitable methods such as a vacuum evaporation method, a spin coating method, a cast method, an LB method, an inkjet printing method, a laser printing method, an LITI method, etc.

When the hole transport region HTR includes the hole injection layer HIL, the hole transport region HTR may include a phthalocyanine compound (such as copper phthalocyanine), DNTPD, m-MTDATA, TDATA, 2-TNATA, PEDOT/PSS, PANI/DBSA, PANI/CSA, PANI/PSS, etc., without being limited thereto.

When the hole transport region HTR includes the hole transport layer HTL, the hole transport region HTR may include a carbazole derivative such as (N-phenylcarbazole or polyvinyl carbazole), a fluorine-based derivative, TPD, a TCTA, NPB, TAPC, etc., without being limited thereto.

The thickness of the hole transport region HTR may be from about 100 Å to about 10,000 Å, for example, from about 100 Å to about 1,000 Å. When the hole transport region HTR includes both the hole injection layer HIL and the hole transport layer HTL, the thickness of the hole injection layer HIL may be from about 100 Å to about 10,000 Å, for example, from about 100 Å to about 1,000 Å; and the thickness of the hole transport layer HTL may be from about 50 Å to about 2,000 Å, for example, from about 100 Å to about 1,500 Å. In one embodiment, when the thicknesses of the hole transport region HTR, the hole injection layer HIL and the hole transport layer HTL satisfy the above-described ranges, satisfactory hole transport properties are obtained without any substantial increase of a driving voltage.

The hole transport region HTR may further include a charge generating material other than the above-described materials to improve the conductivity. The charge generating material may be dispersed in the hole transport region HTR uniformly or non-uniformly. The charge generating material may be, for example, a p-dopant. The p-dopant may be one of a quinone derivative, a metal oxide and a cyano group-containing compound, without being limited thereto. For example, non-limiting examples of the p-dopant may include a quinone derivative (such as TCNQ, F4-TCNQ, etc.), and/or a metal oxide (such as tungsten oxide, molybdenum oxide, etc.), without being limited thereto.

As described above, the hole transport region HTR may further include one of a buffer layer and an electron blocking layer other than the hole injection layer HIL and the hole transport layer HTL. The buffer layer may compensate an optical resonance range according to the wavelength of light emitted from the emission layer EML and increase the light emission efficiency. Materials included in the hole transport region HTR may be utilized as materials included in the buffer layer. The electron blocking layer is a layer for reducing or preventing electron injection from the electron transport region ETR to the hole transport region HTR.

The emission layer EML is provided on the hole transport region HTR. The emission layer EML may have a single layer formed utilizing a single material, a single layer formed utilizing a plurality of different materials, or a multilayered structure including a plurality of layers formed utilizing a plurality of different materials.

The emission layer EML may be formed by utilizing various suitable methods such as a vacuum evaporation method, a spin coating method, a cast method, an LB method, an inkjet printing method, a laser printing method, an LITI method, etc.

The emission layer EML may be formed utilizing a commonly utilized material without specific limitation, and for example, may be formed utilizing a material emitting red, green and blue light and may include a phosphorescent material and/or a fluorescent material. In addition, the emission layer EML may include a host and/or a dopant.

The host may be any suitable material commonly utilized without specific limitations and may include, e.g., Alq3, CBP, PVK, ADN, TCTA, TPBi, TBADN, DSA, CDBP, MADN, etc.

When the emission layer EML emits red light, the emission layer EML may further include a phosphorescent material including, for example, PBD:Eu(DBM)3(Phen) or perylene. When the emission layer EML emits red light, the dopant further included in the emission layer EML may be selected from a metal complex or an organometallic complex (such as PIQIr(acac), PQIr(acac), PQIr, and PtOEP).

When the emission layer EML emits green light, the emission layer EML may further include a phosphorescent material including, for example, Alq3. When the emission layer EML emits green light, the dopant further included in the emission layer EML may be selected from a metal complex or an organometallic complex (such as Ir(ppy)3).

When the emission layer EML emits blue light, the emission layer EML may further include a phosphorescent material including at least one selected from the group consisting of, for example, spiro-DPVBi, spiro-6P, DSB, DSA, a PFO-based polymer and a PPV-based polymer. When the emission layer EML emits blue light, the dopant further included in the emission layer EML may be selected from a metal complex and an organometallic complex (such as (4,6-F2ppy)2Irpic).

The emission layer EML may include a dopant represented by the following Formula 2.

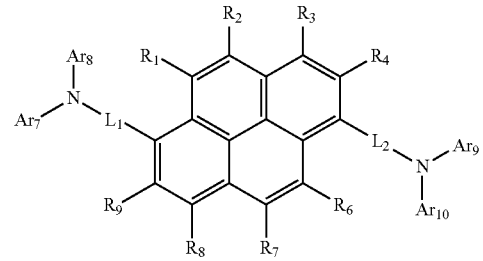

Formula 2

In the above Formula 2, $L_1$ and $L_2$ are each independently selected from hydrogen, deuterium, a substituted or unsubstituted C6-C30 arylene group and a substituted or unsubstituted C2-C30 heteroarylene group. $Ar_7$ to $Ar_{10}$ are each independently selected from hydrogen, deuterium, a substituted or unsubstituted C1-C20 alkyl group, a substituted or unsubstituted C3-C10 cycloalkyl group, a substituted or unsubstituted C6-C30 aryl group and a substituted or unsubstituted C2-C30 heteroaryl group. $Ar_7$ and $Ar_8$, and $Ar_9$ and $Ar_{10}$ may be connected to each other to form a carbazole group.

In the case that $L_1$ and $L_2$ are selected from a substituted alkyl group, a substituted cycloalkyl group, a substituted aryl group and a substituted heteroaryl group, the alkyl group, the cycloalkyl group, the aryl group and the heteroaryl group may be substituted with at least one substituent selected from, e.g., an alkyl group, a hydroxyl group, a cyano group, an alkoxy group, a halogen group, a carboxyl group, an alkoxycarbonyl group, a thionyl group, a thiol group and a sulfone group.

$R_1$ to $R_9$ are each independently selected from hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted C1-C20 alkyl group, a substituted or unsubstituted C2-C20 alkenyl group, a substituted or unsubstituted C2-C20 alkynyl group, a substituted or unsubstituted C1-C20 alkoxy group, a substituted or unsubstituted C3-C10 cycloalkyl group, a substituted or unsubstituted C3-C10 cycloalkenyl group, a substituted or unsubstituted C1-C10 heterocycloalkyl group, a substituted or unsubstituted C2-C10 heterocycloalkenyl group, a substituted or unsubstituted C6-C30 aryl group, a substituted or unsubstituted C1-C30 heteroaryl group, a substituted or unsubstituted C6-C30 aryloxy group, a substituted or unsubstituted C6-C30 arylthio group and a monovalent C6-C30 non-aromatic condensed polycyclic group.

In the case that $R_1$ to $R_9$ are selected from a substituted alkyl group, a substituted alkenyl group, a substituted alkynyl group, a substituted alkoxy group, a substituted cycloalkyl group, a substituted cycloalkenyl group, a substituted heterocycloalkyl group, a substituted heterocycloalkenyl group, a substituted aryl group, a substituted heteroaryl group, a substituted aryloxy group and a substituted arylthio group, the alkyl group, the alkenyl group, the alkynyl group, the alkoxy group, the cycloalkyl group, the cycloalkenyl group, the heterocycloalkyl group, the heterocycloalkenyl group, the aryl group, the heteroaryl group, the aryloxy group and the arylthio group may be substituted with at least one substituent selected from, e.g., an alkyl group, a hydroxyl group, a cyano group, an alkoxy group, a halogen group, a carboxyl group, an alkoxycarbonyl group, a thionyl group, a thiol group and a sulfone group.

The dopant may be a compound represented by the following Formula 3.

Formula 3

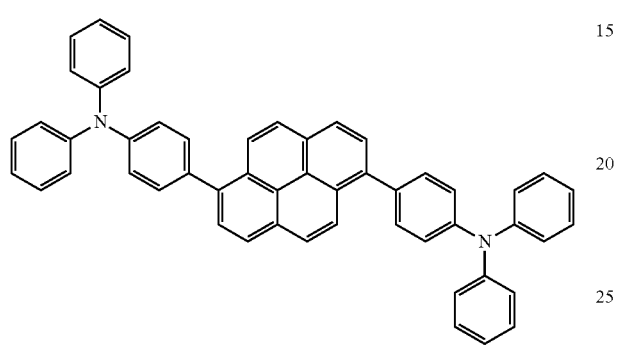

The electron transport region ETR may be provided on the emission layer EML. The electron transport region ETR may be formed by utilizing various suitable methods such as a vacuum evaporation method, a spin coating method, a cast method, an LB method, an inkjet printing method, a laser printing method, an LITI method, etc.

The electron transport region ETR may include an electron transport layer ETL, a first mixed electron transport layer METL1 and a second mixed electron transport layer METL2. The electron transport layer ETL may be provided on the emission layer EML.

The electron transport layer ETL may include at least one of, e.g., Alq3, TPBi, BCP, Bphen, TAZ, NTAZ, tBu-PBD, BAlq, Bebq2 and ADN.

The thickness of the electron transport layer ETL may be from about 40 Å to about 60 Å. The LUMO value of the electron transport layer ETL may be greater than the LUMO value of the first mixed electron transport layer METL1 by about −0.2 eV and above. Thus, the electron transport layer ETL may reduce or prevent the injection of holes into the electron transport region ETR.

The electron transport layer ETL may include a first electron transport compound included in each of the first mixed electron transport layer METL1 and the second mixed electron transport layer METL2. The first electron transport compound will be explained in more detail hereinafter.

The first mixed electron transport layer METL1 may be provided on the electron transport layer ETL. The first mixed electron transport layer METL1 may include the first electron transport compound and the second electron transport compound mixed at a first ratio. The second mixed electron transport layer METL2 may be provided on the first mixed electron transport layer METL1. The second mixed electron transport layer METL2 may include the first electron transport compound and the second electron transport compound mixed at a second ratio which is different from the first ratio. The sum of the thicknesses of the first mixed electron transport layer METL1 and the second mixed electron transport layer METL2 may be from about 310 Å to about 360 Å.

The first electron transport compound may transport the electrons of the electron transport region ETR to the emission layer EML. The first electron transport compound may be selected from compounds represented by the following Formula Group 1.

Formula Group 1

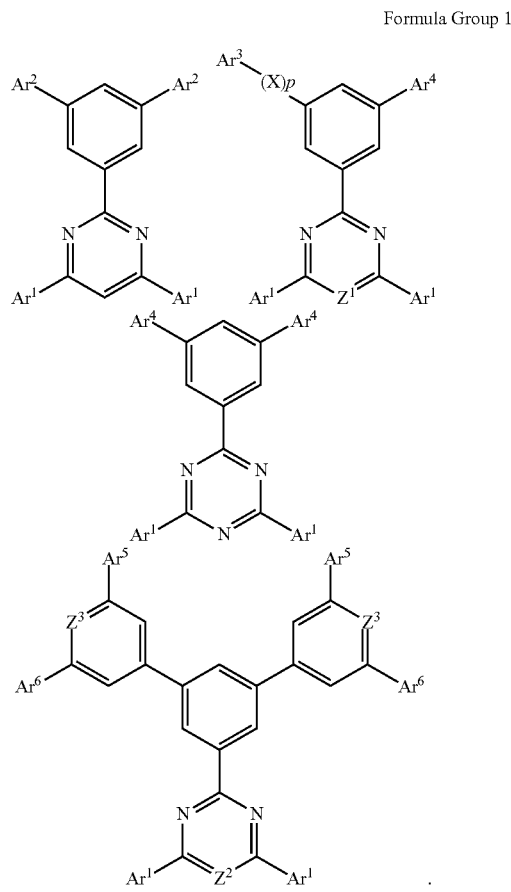

In the above Formula Group 1, $Ar^1$ to $Ar^6$ are each independently selected from hydrogen, deuterium, a substituted or unsubstituted aromatic group, a substituted or unsubstituted condensed aromatic group, a substituted or unsubstituted heteroaromatic group and a substituted or unsubstituted condensed heteroaromatic group, excluding a compound where $Ar^2$ is 1,3,5-trimethylphenyl group. X is a phenylene group or a pyridylene group. P is an integer from 0 to 2, where in the case that P is 2, the two Xs may be the same or different. $Z^1$ to $Z^3$ are each independently C or N, excluding a compound where $Z^3$ is C and each of $Ar^5$ and $Ar^6$ is a phenyl group.

$Ar^1$ may be selected from an aromatic group substituted with an alkyl group, a phenyl group or a pyridyl group; a condensed aromatic group substituted with an alkyl group, a phenyl group or a pyridyl group; a heteroaromatic group substituted with an alkyl group, a phenyl group or a pyridyl group; and a condensed heteroaromatic group substituted with an alkyl group, a phenyl group or a pyridyl group. $Ar^2$ may be a condensed phenyl group excluding a substituted or unsubstituted phenyl group or an element in group 16. $Ar^3$ may be a phenyl group, a pyridyl group or a pyrimidyl group. $Ar^4$ may be a substituted or unsubstituted aromatic group having two to four rings or a substituted or unsubstituted heteroaromatic group having two to four rings. $Ar^5$ and $Ar^6$ may be each independently a phenyl group or a pyridyl group.

The first electron transport compound may be represented by, e.g., the following Formula 1.

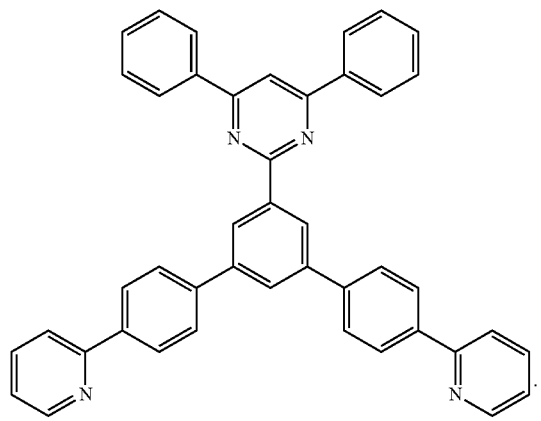

Formula 1

The first ratio may be from about 3:7 to about 7:3, and the second ratio may be from about 4:6 to about 6:4. In the case that the first ratio and the second ratio are in the above-mentioned range, the efficiency may not change according to the temperature, and long life time may be realized. However, in the case that the first ratio and the second ratio are deviated from the above-mentioned range, the efficiency according to the temperature may not be maintained constant, and long life time may not be realized.

The second electron transport compound may be different from the first electron transport compound. The second electron transport compound may reduce or prevent the injection of holes from the emission layer EML into the electron transport region ETR according to the ratio with respect to the first electron transport compound, and decrease energy gap between the first electron transport compound and a compound included in the electron injection layer EIL, thereby facilitating electron transport from the electron injection layer EIL to the second mixed electron transport layer METL2.

The second electron transport compound may be at least one of, e.g., LiF, LiQ, $Li_2O$, BaO, NaCl, CsF, Yb, RbCl and RbI.

The electron transport region ETR may further include at least one of an electron injection layer EIL and a hole blocking layer.

When the electron transport region ETR includes the electron injection layer EIL, the electron transport region ETR may further include LiF, LiQ, $Li_2O$, BaO, NaCl, CsF, a metal in lanthanoides (such as Yb), and/or a metal halide (such as RbCl or RbI), without being limited thereto. The electron injection layer EIL also may be formed utilizing a mixture material of the electron transport material and an insulating organo metal salt. The organo metal salt may be a material having an energy band gap of greater than or equal to about 4 eV. For example, the organo metal salt may include, a metal acetate, a metal benzoate, a metal acetoacetate, a metal acetylacetonate and/or a metal stearate. The thickness of the electron injection layer EIL may be from about 1 Å to about 100 Å, and from about 3 Å to about 90 Å. In one embodiment, when the thickness of the electron injection layer EIL satisfies the above described ranges, satisfactory electron injection properties are obtained without inducing any substantial increase of a driving voltage.

The electron transport region ETR may include a hole blocking layer, as described above. The hole blocking layer may include at least one of, for example, BCP and Bphen, without being limited thereto. The thickness of the hole blocking layer may be from about 20 Å to about 1,000 Å, for example, from about 30 Å to about 300 Å. In one embodiment, when the thickness of the hole blocking layer satisfies the above described range, satisfactory hole blocking properties are obtained without inducing any substantial increase of a driving voltage.

The second electrode EL2 may be provided on the electron transport region ETR. The second electrode EL2 may be a common electrode or a cathode. The second electrode EL2 may be a transmission electrode, transflective electrode or reflection electrode.

When the second electrode EL2 is the transmission electrode, the second electrode EL2 may include Li, Ca, LiF/Ca, LiF/Al, Al, Mg, BaF, Ba, Ag, a compound thereof or a mixture thereof (for example, a mixture of Ag and Mg).

The second electrode EL2 may include an auxiliary electrode. The auxiliary electrode may include a layer formed by evaporating the above-described material toward an emission layer, a transparent metal oxide on the layer, for example, ITO, IZO, ZnO, ITZO, Mo, Ti, etc.

When the second electrode EL2 is the transflective electrode or the reflection electrode, the second electrode EL2 may include Ag, Mg, Al, Pt, Pd, Au, Ni, Nd, Ir, Cr, Li, Ca, LiF/Ca, LiF/Al, Mo, Ti, a compound thereof or a mixture thereof (for example, a mixture of Ag and Mg). The second electrode EL2 may be a reflective layer or a transflective layer formed utilizing the above material and a multilayered structure including (e.g., further including) a transparent conductive layer formed utilizing ITO, IZO, ZnO, ITZO, etc.

When the organic light emitting device OEL is a front luminescent device, the first electrode EL1 may be the reflection electrode, and the second electrode EL2 may be the transmission electrode or the transflective electrode. When the organic light emitting device is a backside luminescent device, the first electrode EL1 may be the transmission electrode or the transflective electrode, and the second electrode EL2 may be the reflection electrode.

In the organic light emitting device OEL according to an embodiment of the inventive concept, according to the application of a voltage to the first electrode EL1 and the second electrode EL2, respectively, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light is emitted during the transition of the excitons from an excited state to a ground state.

Even though not shown, an organic capping layer may be provided on the second electrode EL2. The organic capping layer may reflect emitted light from the emission layer EML at the top surface of the organic capping layer toward the emission layer EML. The reflected light may be amplified by the resonance effect in an organic layer to increase the light efficiency of a display device 10. In the front luminescent organic light emitting device, the organic capping layer may reduce or prevent the loss of light at the second electrode EL2 via the total reflection of light.

The organic capping layer may include any suitable material commonly utilized without specific limitations, e.g., at least one of TPD15, TCTA, α-NPD.

The organic capping layer may have refractive index in a range from about 1.6 to about 2.4. In the case that the refractive index of the organic capping layer is smaller than 1.6, light emitted from the emission layer EML may be insufficiently reflected at the top surface of the organic capping layer toward the emission layer EML, and the amount of light which may be amplified by resonance effect may decrease. Thus, the light efficiency of the organic light emitting device OEL may decrease. In the case that the refractive index of the organic capping layer is greater than about 2.4, light emitted from the emission layer EML may be excessively reflected at the top surface of the organic capping layer toward the emission layer EML, and the amount of light passing through the organic capping layer for displaying images may decrease.

Generally, the moving velocity of electrons is smaller than that of holes in an organic light emitting device, and a band gap between the energy band of a hole transport region and the energy band of an emission layer and a band gap between the energy band of the emission layer and the energy band of an electron transport region may be generated. Thus, the injection of the holes and electrons into the emission layer may not be easy, and the probability of the recombination of the electrons and the holes in the emission layer may be low, thereby deteriorating the emission efficiency. In addition, the change of efficiency may be large according to the change of the temperature, and the realization of long life time may be difficult.

The display device according to an embodiment of the inventive concept includes an electron transport layer, a first mixed electron transport layer including a first electron transport compound and a second electron transport compound mixed at a first ratio, and a second mixed electron transport layer including the first electron transport compound and the second electron transport compound mixed at a second ratio. Thus, the band gap between the energy band of the hole transport region and the energy band of the emission layer may be decreased, and the injection of holes into the emission layer may become easy in the display device. In addition, the band gap between the energy band of the emission layer and the energy band of the electron transport region may be decreased, and the injection of electrons into the emission layer may become easy. Accordingly, high efficiency and long life time may be realized in the display device according to an embodiment of the inventive concept. Further, efficiency change according to temperature change may be reduced and long life time may be realized in the display device according to an embodiment of the inventive concept.

Hereinafter, the inventive concept will be explained in more detail referring to particular embodiments. However, the following embodiments are illustrated to assist the understanding of the inventive concept, and the scope of the inventive concept is not limited thereto.

EXAMPLES

Example 1

On a glass substrate, Al reflection layer of a first electrode was formed, and ITO was deposited on the reflection layer formed utilizing Al. On the ITO, organic layers were formed by evaporating the following compounds: compounds represented by Formula Group 2 doped with a compound represented by Formula 4 as a hole transport region, a compound represented by Formula 5 as the host and a compound represented by Formula 6 as a dopant of an emission layer, a compound represented by Formula 7 as an electron transport layer, a compound represented by Formula 7 and LiQ at a ratio of about 7:3 as a first mixed electron transport layer, a compound represented by Formula 7 and LiQ at a ratio of about 5:5 as a second mixed electron transport layer, and Ag and Mg at a ratio of about 1:9 as a second electrode.

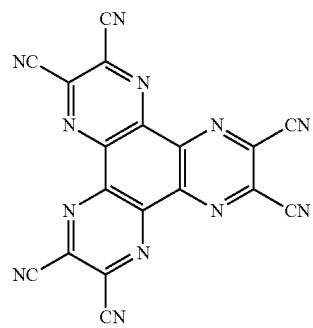

Formula 4

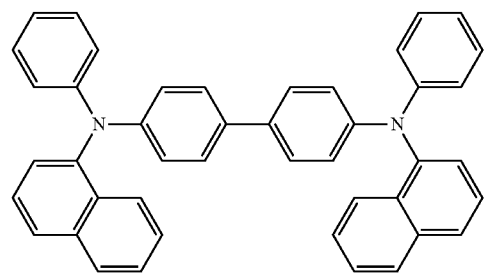

Formula Group2

Formula 5

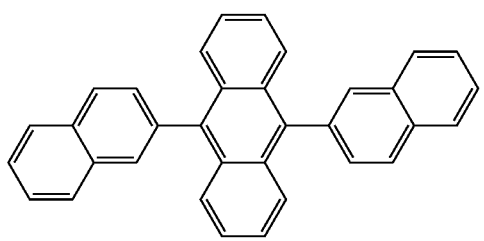

Formula 6

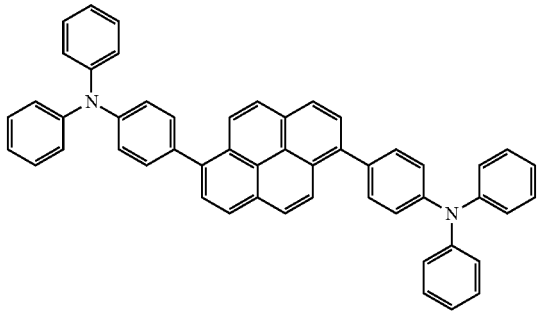

Formula 7

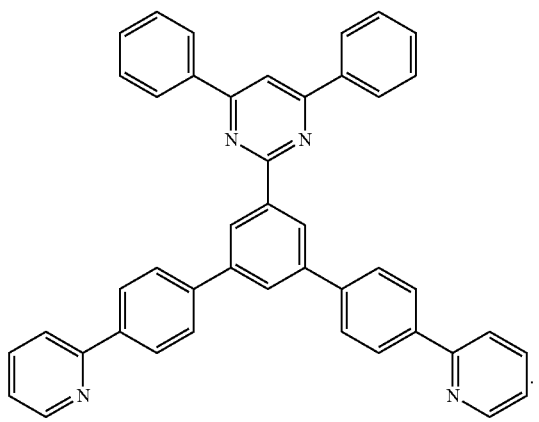

Example 2

The substantially same procedure was conducted as explained in Example 1 except for depositing the compound represented by Formula 7 and LiQ at a ratio of about 3:7 as the first mixed electron transport layer.

Comparative Example 1

The substantially same procedure was conducted as explained in Example 1 except for excluding the second mixed electron transport layer.

Comparative Example 2

The substantially same procedure was conducted as explained in Example 1 except for excluding the electron transport layer.

Experimental Results 1

Current efficiency was measured for Example 1, Comparative Example 1 and Comparative Example 2. The current efficiency was obtained by measuring the current efficiency of an organic light emitting device while driving with a current density of about 10 mA/cm².

TABLE 1

| | OP. V | CIE_x | CIE_y | B_efficiency/y |
|---|---|---|---|---|
| Example 1 | 4.5 | 0.138 | 0.053 | 135.3 |
| Comparative Example 1 | 4.4 | 0.138 | 0.054 | 134.1 |
| Comparative Example 2 | 4.5 | 0.140 | 0.050 | 107.1 |

Referring to Table 1, the efficiency of Comparative Example 1 was lower than that of Example 1.

Experimental Results 2

Figure 7:
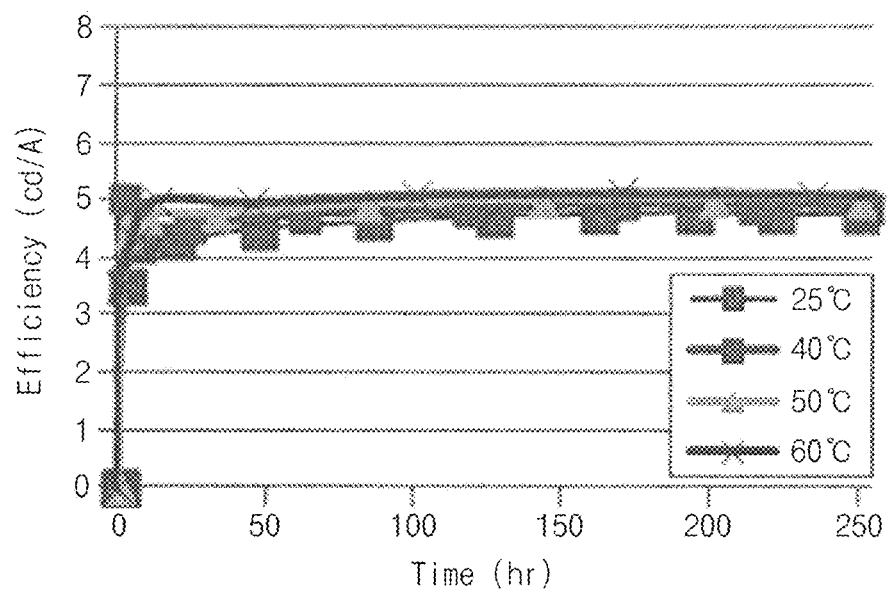
FIG. 7 is a graph schematically illustrating the relation of efficiency (i.e., emission efficiency) and time according to temperature in a device manufactured according to Example 1.
Figure 8:
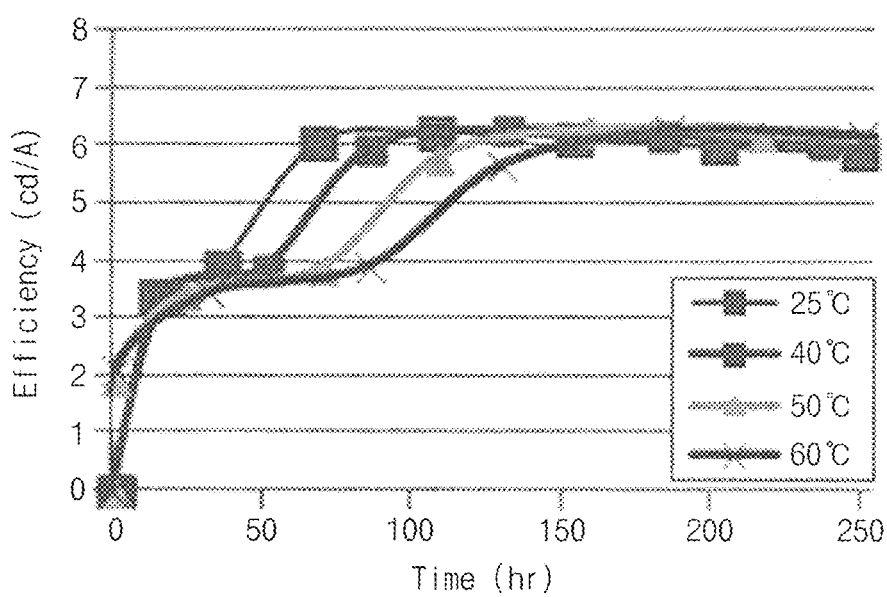
FIG. 8 is a graph schematically illustrating the relation of efficiency and time according to temperature in a device manufactured according to Example 2.

The relation between time and efficiency according to temperature (i.e., at various temperatures) was measured for Examples 1 and 2. Referring to FIGS. 7 (Example 1) and 8 (Example 2), it would be secured (noted) that the efficiency change of each of Examples 1 and 2 according to the temperature was not significant.

Experimental Results 3

Figure 9:
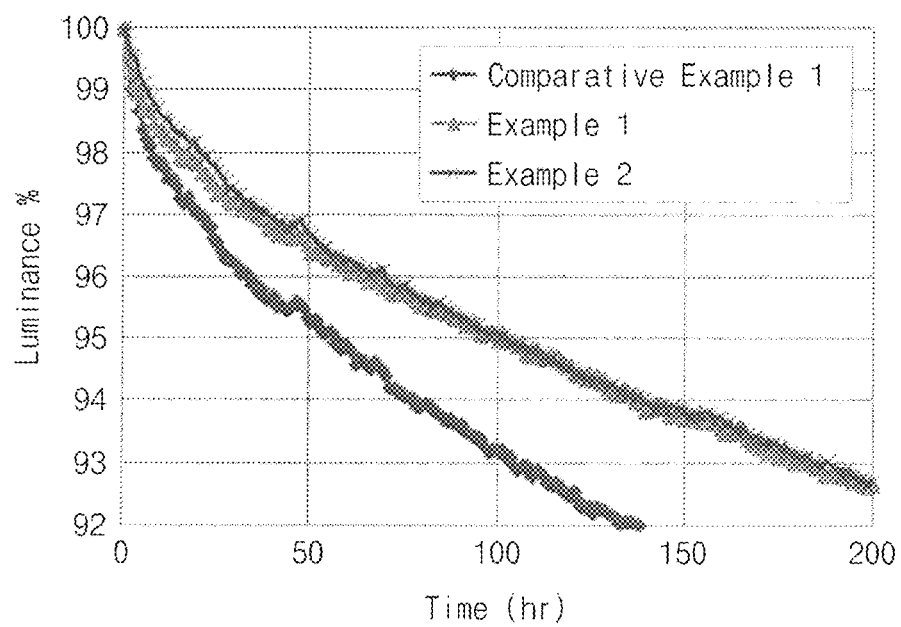
FIG. 9 is a graph schematically illustrating the degree of luminance decrease with respect to time in devices manufactured according to Examples 1 and 2 and Comparative Example 1.

The degree of luminance decrease was measured according to time for Examples 1 and 2 and Comparative Example 1. Referring to FIG. 9, it would be secured (noted) that the life time of each of Examples 1 and 2 was longer than that of Comparative Example 1.

Expressions such as "at least one of," when preceding a list of elements, modify the entire list of elements and do not modify the individual elements of the list. Further, the use of "may" when describing embodiments of the present invention refers to "one or more embodiments of the present invention." As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

The above-disclosed subject matter is to be considered illustrative and not restrictive, and the appended claims, and equivalents thereof, are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. An organic light emitting device, comprising:
a first electrode;
a hole transport region on the first electrode;
an emission layer on the hole transport region;
an electron transport region on the emission layer; and
a second electrode on the electron transport region,
wherein the electron transport region comprises:
an electron transport layer on the emission layer;
a first mixed electron transport layer on the electron transport layer; and
a second mixed electron transport layer on the first mixed electron transport layer,
wherein the first mixed electron transport layer comprises:
a first electron transport compound and a second electron transport compound different from the first electron transport compound mixed at a first ratio,
wherein the second mixed electron transport layer comprises:
the first electron transport compound and the second electron transport compound mixed at a second ratio different from the first ratio,
wherein the first ratio is from about 3:7 to about 7:3, and the second ratio is from about 4:6 to about 6:4, and
wherein a lowest unoccupied molecular orbital value of the electron transport layer is greater than a lowest unoccupied molecular orbital value of the first mixed electron transport layer by about −0.2 eV or greater.

2. The organic light emitting device of claim 1, wherein the first electron transport compound is selected from compounds represented by following Formula Group 1:

Formula Group 1

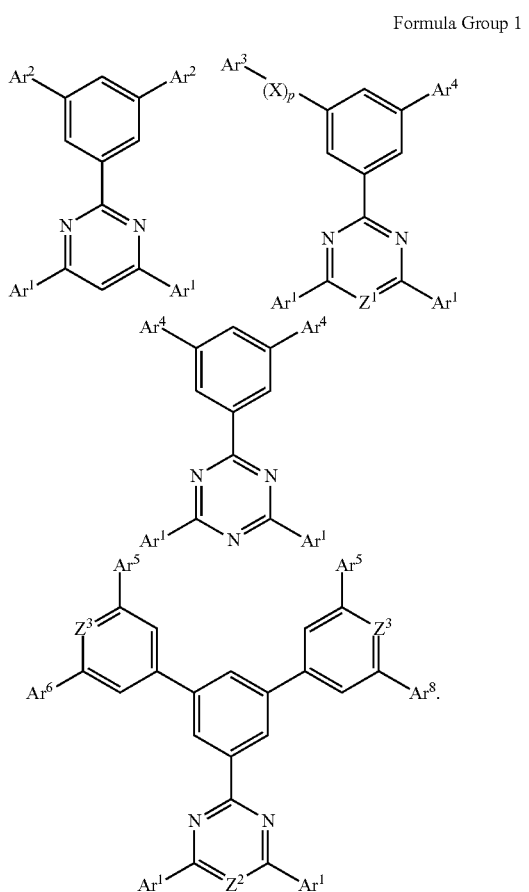

wherein in Formula Group 1,
Ar$^1$ to Ar$^6$ are each independently selected from hydrogen, deuterium, a substituted or unsubstituted aromatic group, a substituted or unsubstituted condensed aromatic group, a substituted or unsubstituted heteroaromatic group and a substituted or unsubstituted condensed heteroaromatic group, excluding a compound where Ar$^2$ is 1,3,5-trimethylphenyl group;

X is a phenylene group or a pyridylene group;

P is an integer from 0 to 2, where when P is 2, the two Xs are the same or different; and Z$^1$ to Z$^3$ are each independently C or N, excluding a compound where Z$^3$ is C and each of Ar$^5$ and Ar$^6$ is a phenyl group.

3. The organic light emitting device of claim 2, wherein

Ar$^1$ is selected from the group consisting of an aromatic group substituted with an alkyl group, a phenyl group or a pyridyl group; a condensed aromatic group substituted with an alkyl group, a phenyl group or a pyridyl group; a heteroaromatic group substituted with an alkyl group, a phenyl group or a pyridyl group; and a condensed heteroaromatic group substituted with an alkyl group, a phenyl group or a pyridyl group;

Ar$^2$ is a condensed phenyl group excluding a substituted or unsubstituted phenyl group or an element in group 16;

Ar$^3$ is a phenyl group, a pyridyl group or a pyrimidyl group;

Ar$^4$ is a substituted or unsubstituted aromatic group having two to four rings or a substituted or unsubstituted heteroaromatic group having two to four rings; and Ar$^5$ and Ar$^6$ are each independently a phenyl group or a pyridyl group.

4. The organic light emitting device of claim 1, wherein the first electron transport compound is represented by following Formula 1:

Formula 1

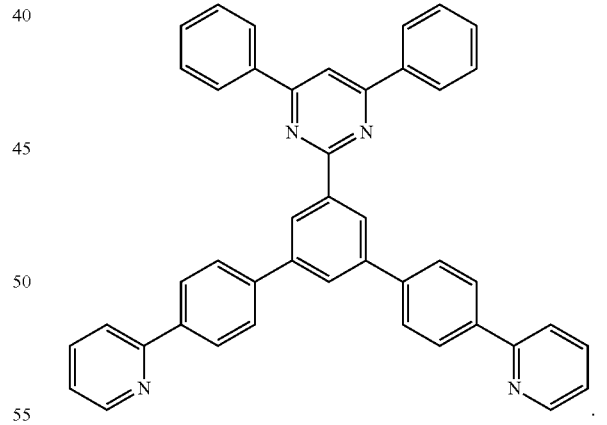

5. The organic light emitting device of claim 2, wherein the electron transport layer comprises the first electron transport compound.

6. The organic light emitting device of claim 1, wherein the second electron transport compound is at least one of LiF, Lithium quinolate (LiQ), Li$_2$O, BaO, NaCl, CsF, Yb, RbCl and RbI.

7. The organic light emitting device of claim 1, wherein the emission layer comprises a dopant represented by following Formula 2:

Formula 2

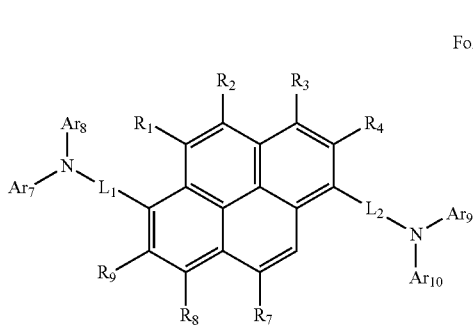

wherein in Formula 2, $L_1$ and $L_2$ are each independently selected from hydrogen, deuterium, a substituted or unsubstituted C6-C30 arylene group and a substituted or unsubstituted C2-C30 heteroarylene group;

$Ar_7$ to $Ar_{10}$ are each independently selected from hydrogen, deuterium, a substituted or unsubstituted C1-C20 alkyl group, a substituted or unsubstituted C3-C10 cycloalkyl group, a substituted or unsubstituted C6-C30 aryl group and a substituted or unsubstituted C2-C30 heteroaryl group; and $R_1$ to $R_9$ are each independently selected from hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted C1-C20 alkyl group, a substituted or unsubstituted C2-C20 alkenyl group, a substituted or unsubstituted C2-C20 alkynyl group, a substituted or unsubstituted C1-C20 alkoxy group, a substituted or unsubstituted C3-C10 cycloalkyl group, a substituted or unsubstituted C3-C10 cycloalkenyl group, a substituted or unsubstituted C1-C10 heterocycloalkyl group, a substituted or unsubstituted C2-C10 heterocycloalkenyl group, a substituted or unsubstituted C6-C30 aryl group, a substituted or unsubstituted C1-C30 heteroaryl group, a substituted or unsubstituted C6-C30 aryloxy group, a substituted or unsubstituted C6-C30 arylthio group and a monovalent C6-C30 non-aromatic condensed polycyclic group.

8. The organic light emitting device of claim 7, wherein the dopant is represented by the following Formula 3:

Formula 3

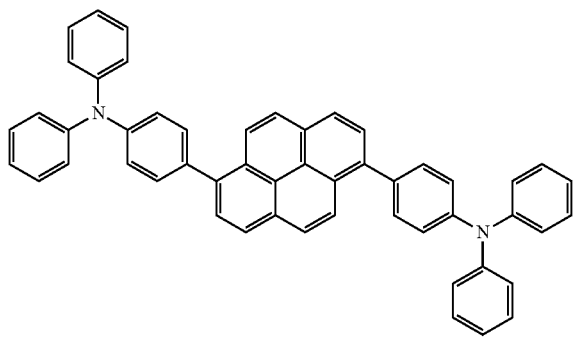

9. The organic light emitting device of claim 1, wherein the electron transport layer comprises at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2) and 9,10-di(naphthalene-2-yl)anthracene (ADN).

10. A display device comprising a plurality of pixels, wherein at least one of the pixels comprises:
a first electrode;
a hole transport region on the first electrode;
an emission layer on the hole transport region;
an electron transport region on the emission layer; and
a second electrode on the electron transport region,
wherein the electron transport region comprises:
an electron transport layer on the emission layer;
a first mixed electron transport layer on the electron transport layer; and
a second mixed electron transport layer on the first mixed electron transport layer,
wherein the first mixed electron transport layer comprises:
a first electron transport compound and a second electron transport compound different from the first electron transport compound mixed at a first ratio,
wherein the second mixed electron transport layer comprises:
the first electron transport compound and the second electron transport compound mixed at a second ratio different from the first ratio,
wherein the first ratio is from about 3:7 to about 7:3, and the second ratio is from about 4:6 to about 6:4, and
wherein a lowest unoccupied molecular orbital value of the electron transport layer is greater than a lowest unoccupied molecular orbital value of the first mixed electron transport layer by about −0.2 eV or greater.

11. The display device of claim 10, wherein the first electron transport compound is selected from compounds represented by following Formula Group 1:

Formula Group 1

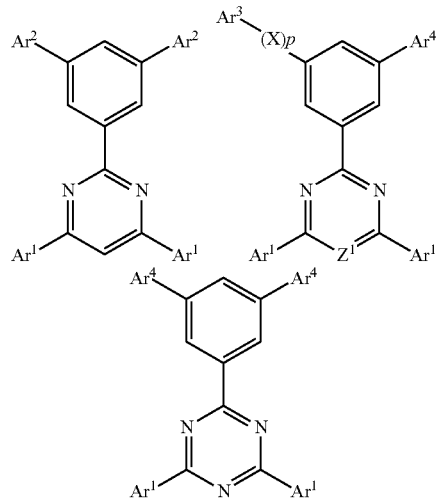

-continued

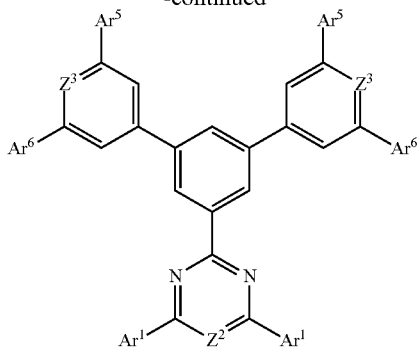

wherein in Formula Group 1, $Ar^1$ to $Ar^6$ are each independently selected from the group consisting of hydrogen, deuterium, a substituted or unsubstituted aromatic group, a substituted or unsubstituted condensed aromatic group, a substituted or unsubstituted heteroaromatic group and a substituted or unsubstituted condensed heteroaromatic group, excluding a compound where $Ar^2$ is 1,3,5-trimethylphenyl group;

X is a phenylene group or a pyridylene group;

P is an integer from 0 to 2, where when P is 2, the two Xs are the same or different; and $Z^1$ to $Z^3$ are each independently C or N, excluding a compound where $Z^3$ is C and each of $Ar^5$ and $Ar^6$ is a phenyl group.

12. The display device of claim 11, wherein $Ar^1$ is selected from the group consisting of an aromatic group substituted with an alkyl group, a phenyl group or a pyridyl group; a condensed aromatic group substituted with an alkyl group, a phenyl group or a pyridyl group; a heteroaromatic group substituted with an alkyl group, a phenyl group or a pyridyl group; and a condensed heteroaromatic group substituted with an alkyl group, a phenyl group or a pyridyl group;

$Ar^2$ is a condensed phenyl group excluding a substituted or unsubstituted phenyl group or an element in group 16;

$Ar^3$ is a phenyl group, a pyridyl group or a pyrimidyl group;

$Ar^4$ is a substituted or unsubstituted aromatic group having two to four rings or a substituted or unsubstituted heteroaromatic group having two to four rings; and $Ar^5$ and $Ar^6$ are each independently a phenyl group or a pyridyl group.

13. The display device of claim 10, wherein the first electron transport compound is represented by following Formula 1:

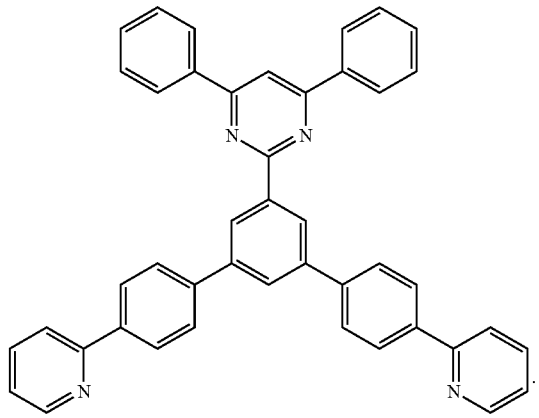

Formula 1

14. The display device of claim 11, wherein the electron transport layer comprises the first electron transport compound.

15. The display device of claim 10, wherein the second electron transport compound is at least one of LiF, Lithium quinolate (LiQ), $Li_2O$, BaO, NaCl, CsF, Yb, RbCl and RbI.

16. The display device of claim 10, wherein the emission layer comprises a dopant represented by following Formula 2:

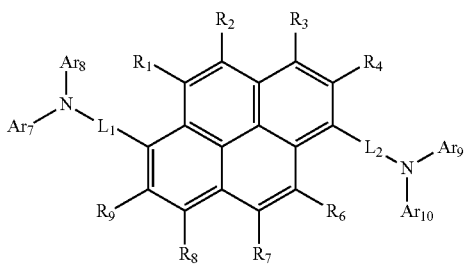

Formula 2 wherein in Formula 2, $L_1$ and $L_2$ are each independently selected from hydrogen, deuterium, a substituted or unsubstituted C6-C30 arylene group and a substituted or unsubstituted C2-C30 heteroarylene group;

$Ar_7$ to $Ar_{10}$ are each independently selected from hydrogen, deuterium, a substituted or unsubstituted C1-C20 alkyl group, a substituted or unsubstituted C3-C10 cycloalkyl group, a substituted or unsubstituted C6-C30 aryl group and a substituted or unsubstituted C2-C30 heteroaryl group; and $R_1$ to $R_9$ are each independently selected from hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted C1-C20 alkyl group, a substituted or unsubstituted C2-C20 alkenyl group, a substituted or unsubstituted C2-C20 alkynyl group, a substituted or unsubstituted C1-C20 alkoxy group, a substituted or unsubstituted C3-C10 cycloalkyl group, a substituted or unsubstituted C3-C10 cycloalkenyl group, a substituted or unsubstituted C1-C10 heterocycloalkyl group, a substituted or unsubstituted C2-C10 heterocycloalkenyl group, a substituted or unsubstituted C6-C30 aryl group, a substituted or unsubstituted C1-C30 heteroaryl group, a substituted or unsubstituted C6-C30 aryloxy group, a substituted or unsubstituted C6-C30 arylthio group and a monovalent C6-C30 non-aromatic condensed polycyclic group.

17. The display device of claim 16, wherein the dopant is represented by the following Formula 3:

Formula 3

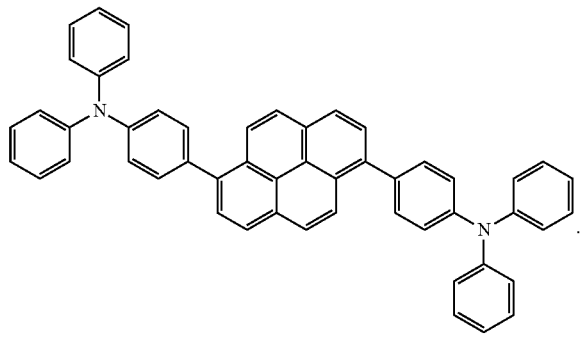

18. The display device of claim 10, wherein the electron transport layer comprises at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2) and 9,10-di(naphthalene-2-yl)anthracene (ADN).

19. The organic light emitting device of claim 1, wherein the electron transport layer consists of the first electron transport compound, the first mixed electron transport layer consists of the first electron transport compound and the second electron transport compound, and the second mixed electron transport layer consists of the first electron transport compound and the second electron transport compound.

* * * * *